(12) United States Patent
Nakata et al.

(10) Patent No.: US 11,917,306 B2
(45) Date of Patent: Feb. 27, 2024

(54) ELECTRONIC DEVICE THAT CORRECTS IMAGES CAPTURED ON A SIDE OPPOSITE A DISPLAYING SURFACE

(71) Applicant: Sony Semiconductor Solutions Corporation, Kanagawa (JP)

(72) Inventors: Masashi Nakata, Kanagawa (JP); Tomohiro Yamazaki, Kanagawa (JP); Junichi Kanai, Kanagawa (JP); Yuichiro Baba, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 76 days.

(21) Appl. No.: 17/185,037

(22) Filed: Feb. 25, 2021

(65) Prior Publication Data

US 2021/0266425 A1 Aug. 26, 2021

Related U.S. Application Data

(63) Continuation of application No. PCT/JP2020/038005, filed on Oct. 7, 2020.

(30) Foreign Application Priority Data

Oct. 7, 2019 (JP) .................................. 2019-184761

(51) Int. Cl.
*H04N 23/81* (2023.01)
*H04N 23/53* (2023.01)
(Continued)

(52) U.S. Cl.
CPC ........... *H04N 23/81* (2023.01); *G02B 5/3058* (2013.01); *H01L 27/14625* (2013.01);
(Continued)

(58) Field of Classification Search
CPC .... H04N 5/213; H04N 5/2173; H04N 5/2176; H04N 5/2178; H04N 5/22525;
(Continued)

(56) References Cited

U.S. PATENT DOCUMENTS

2010/0283883 A1* 11/2010 Sato ....................... H04N 23/56
348/E5.025
2011/0090376 A1* 4/2011 Ichikawa ................ G06T 5/003
348/241

(Continued)

FOREIGN PATENT DOCUMENTS

CN 102411878 A 4/2012
CN 103533250 A 1/2014
(Continued)

OTHER PUBLICATIONS

Anonymous: "Pixelfehler—Wikipedia", Feb. 19, 2019 (Feb. 19, 2019), XP55966337, 1-3 pages.

(Continued)

*Primary Examiner* — Paul M Berardesca
(74) *Attorney, Agent, or Firm* — Michael Best & Friedrich LLP

(57) ABSTRACT

Provided is an electronic device that decreases a width of a bezel, and restricts a decrease in an image quality of an image captured with a camera.
The electronic device includes: a displaying unit; and a capture unit arranged on a side opposite a displaying surface of the displaying unit. The capture unit includes: a plurality of photoelectric-conversion units that converts light that has been made to enter through the displaying unit into electricity; and a plurality of polarization elements arranged on a light entering side of at least one photoelectric-conversion unit of the plurality of photoelectric-conversion units.

19 Claims, 29 Drawing Sheets

(51) Int. Cl.
*H04N 23/55* (2023.01)
*H04N 23/57* (2023.01)
*H04N 25/703* (2023.01)
*H04N 25/13* (2023.01)
*H01L 27/146* (2006.01)
*G02B 5/30* (2006.01)

(52) U.S. Cl.
CPC ............. *H04N 23/53* (2023.01); *H04N 23/55* (2023.01); *H04N 23/57* (2023.01); *H04N 25/134* (2023.01); *H04N 25/703* (2023.01); *H01L 27/1464* (2013.01)

(58) Field of Classification Search
CPC ........... H04N 5/225251; H04N 5/2253; H04N 5/2254; H04N 5/2257; H04N 5/23229; H04N 5/3696; H04N 5/357; H04N 5/3572; H04N 5/35721; H04N 23/53; H04N 23/531; H04N 23/54; H04N 23/55; H04N 23/57; H04N 25/11–136; H04N 25/60–6153; H04N 25/702; H04N 25/703; H04N 25/708; H04N 23/80–88; G02B 5/30–3091; G01J 4/00–04; H04M 1/0264–0269; G06F 1/16–1686; H10K 59/00; H10K 59/65; H10K 59/70
See application file for complete search history.

(56) References Cited

U.S. PATENT DOCUMENTS

| | | | |
|---|---|---|---|
| 2013/0088630 A1 | 4/2013 | Kanade | |
| 2014/0092227 A1* | 4/2014 | Kanamori | G01J 1/0209 348/68 |
| 2014/0218486 A1 | 8/2014 | Kobayashi | |
| 2015/0029389 A1* | 1/2015 | Masanori | G02F 1/0136 348/373 |
| 2015/0141753 A1* | 5/2015 | Kanamori | G02B 23/2484 600/109 |
| 2016/0195429 A1* | 7/2016 | Boettiger | G01J 3/0259 250/208.2 |
| 2016/0269694 A1* | 9/2016 | Masuda | H04N 23/16 |
| 2016/0365377 A1* | 12/2016 | Takahashi | G02B 27/0037 |
| 2017/0070689 A1* | 3/2017 | Silverstein | H04N 25/671 |
| 2017/0287992 A1* | 10/2017 | Kwak | G06F 1/1652 |
| 2018/0013988 A1* | 1/2018 | Kondo | H04N 9/646 |
| 2018/0069060 A1 | 3/2018 | Rappoport et al. | |
| 2018/0302597 A1* | 10/2018 | Honda | G02B 5/3058 |
| 2018/0309949 A1* | 10/2018 | Fossum | G02B 5/201 |
| 2018/0359401 A1* | 12/2018 | Oyaizu | H04N 23/73 |
| 2019/0166342 A1* | 5/2019 | Kondo | G01J 4/04 |
| 2019/0188827 A1* | 6/2019 | Mitani | G06T 7/33 |
| 2019/0260974 A1* | 8/2019 | Kaizu | H04N 25/76 |
| 2019/0273856 A1* | 9/2019 | Hirasawa | H04N 23/75 |
| 2019/0373166 A1* | 12/2019 | Jia | H04M 1/0264 |
| 2020/0013819 A1 | 1/2020 | Toda | |
| 2020/0076999 A1* | 3/2020 | Akiyama | H01L 27/14603 |
| 2020/0103511 A1* | 4/2020 | Jin | H01L 27/1462 |
| 2020/0204729 A1 | 6/2020 | Kurita | |
| 2021/0014412 A1* | 1/2021 | Miyatani | H04N 5/30 |
| 2021/0029336 A1* | 1/2021 | Liu | H04N 23/57 |
| 2021/0126078 A1* | 4/2021 | Lee | H10K 59/88 |
| 2021/0141274 A1 | 5/2021 | Wei | |
| 2021/0211619 A1* | 7/2021 | Mihara | H04N 25/63 |
| 2021/0235006 A1* | 7/2021 | Ono | H04N 23/72 |
| 2021/0256932 A1* | 8/2021 | Min, II | G09G 5/10 |
| 2021/0280618 A1* | 9/2021 | Yamashita | H04N 23/55 |
| 2021/0306584 A1* | 9/2021 | Moriyama | G02B 5/201 |
| 2021/0384179 A1* | 12/2021 | Bok | H10K 59/352 |
| 2022/0130879 A1* | 4/2022 | Yamazaki | H04N 25/702 |
| 2022/0210322 A1* | 6/2022 | Hirasawa | H04N 23/55 |
| 2022/0385863 A1* | 12/2022 | Kishine | G03B 7/00 |

FOREIGN PATENT DOCUMENTS

| | | |
|---|---|---|
| CN | 104345468 A | 2/2015 |
| CN | 109348195 A | 2/2019 |
| CN | 109948410 A | 6/2019 |
| JP | 2007-163816 A | 6/2007 |
| JP | 2012-213137 A | 11/2012 |
| JP | 2019114842 A | 7/2019 |
| TW | 200809757 A | 2/2008 |
| TW | 201713970 A | 4/2017 |
| WO | 2018/042817 A1 | 3/2018 |
| WO | WO-2018159738 A1 | 9/2018 |
| WO | WO-2018230119 A1 | 12/2018 |

OTHER PUBLICATIONS

International Search Report (PCT/ISA/210), International Application No. PCT/JP2020/038005, dated Dec. 1, 2020.
Notification of Transmittal of the International Search Report and the Written Opinion of the International Searching Authority, or the Declaration (PCT/ISA/220), International Application No. PCT/JP2020/038005, dated Dec. 15, 2020.
Written Opinion of the International Search Authority (PCT/ISA/237), International Application No. PCT/JP2020/038005, dated Dec. 15, 2020.
Taiwanese Office Action dated Dec. 11, 2023 for corresponding Taiwanese Application No. 109134285.

* cited by examiner

ELECTRONIC DEVICE THAT CORRECTS IMAGES CAPTURED ON A SIDE OPPOSITE A DISPLAYING SURFACE

TECHNICAL FIELD

Description

The present disclosure relates to an electronic device.

BACKGROUND ART

Electronic devices, such as the latest smartphones, mobile phones, and personal computers (PCs), are equipped with a camera in a bezel of a displaying unit, and allow videotelephony and movie imaging to be easily performed. A smartphone or a mobile phone is often carried in a pocket or a bag. An external size needs to be made as compact as possible. On the other hand, if a size of a displaying screen is small, as display resolution becomes higher, a displayed letter size becomes smaller, and it is more difficult to see. Therefore, it is being considered to decrease a bezel width around a displaying screen to increase a size of the displaying screen as large as possible without increasing an external size of the electronic device.

However, a bezel of an electronic device is often equipped with a camera and the like. Therefore, a bezel width cannot be made smaller than an outer diameter of the camera.

Furthermore, in a case where a camera is arranged in a bezel, a line-of-sight is often arranged near the center of a displaying screen during, for example, videotelephony conversation. Therefore, the line-of-sight is away from an optical axis of the camera, and an imaged picture where there is such a sense of incongruity that the line-of-sight does not correspond is obtained.

To avoid the problems described above, it is proposed that a camera module is arranged on a side opposite a displaying surface of a displaying unit, and subject light that has passed the displaying unit is imaged with a camera.

CITATION LIST

Patent Document

Patent Document 1: US Patent Publication 2018/0069060

SUMMARY OF THE INVENTION

Problems to be Solved by the Invention

However, part of light that passes a displaying unit causes reflection or diffraction, and enters a camera. Therefore, there is a problem that an effect of a flare or diffraction due to the reflection decreases an image quality of an imaged picture.

An aspect of the present disclosure provides an electronic device that decreases a width of a bezel, and restricts a decrease in an image quality of an image captured with a camera.

Solutions to Problems

To solve the problems described above, the present disclosure provides an electronic device including:

a displaying unit; and a capture unit arranged on a side opposite a displaying surface of the displaying unit, in which the capture unit includes:

a plurality of photoelectric-conversion units that converts light that has been made to enter through the displaying unit into electricity; and a plurality of polarization elements arranged on a light entering side of at least one photoelectric-conversion unit of the plurality of photoelectric-conversion units.

A correction unit that corrects a captured image that has been converted from light into electricity by the plurality of photoelectric-conversion units, on the basis of polarization information that has been polarized by the plurality of polarization elements and has been converted from light into electricity by the photoelectric-conversion unit may be further provided.

The correction unit may remove a component that includes at least one of reflected light or diffracted light that has occurred when the reflected light or the diffracted light passes the displaying unit, has been made to enter the plurality of photoelectric-conversion units, and has been captured.

The correction unit may perform subtraction processing of a correction amount based on polarization information data that includes the polarization information that has been digitalized, to digital pixel data that has been converted from light into electricity by the photoelectric-conversion units and has been digitalized, to correct the digital pixel data.

A polarization member that is provided for the displaying unit and polarizes light that has been made to enter, into a particular direction may be further provided.

At least one of the plurality of polarization elements may make light polarized by the polarization member pass.

The correction unit may correct a captured image that has been converted from light into electricity by the plurality of photoelectric-conversion units, on the basis of the polarization information that has been polarized by the polarization member, has passed the polarization element, and has been converted from light into electricity by the photoelectric-conversion unit.

A light-source estimating unit that estimates a type of a light source of light made to enter the displaying unit may be further provided.

The correction unit may control a correction amount of a captured image that has been converted from light into electricity by the plurality of photoelectric-conversion units, on the basis of a type of a light source estimated by the light-source estimating unit.

A luminance estimating unit that estimates display luminance of the displaying unit may be further provided.

The correction unit may control a correction amount of a captured image that has been converted from light into electricity by the plurality of photoelectric-conversion units, according to display luminance of the displaying unit.

A signal processing unit that performs at least one of exposure processing, focus adjustment processing, or white balance control processing, to a captured image corrected by the correction unit may be further provided.

A signal processing unit that performs at least one type of signal processing to a captured image corrected by the correction unit; and a parameter control unit that controls a parameter when the signal processing is performed to the captured image, according to a correction amount with which the correction unit corrects the captured image may be further provided.

The signal processing performed by the signal processing unit may include at least one of noise reduction processing that removes a noise component contained in the captured image, or edge emphasis processing that emphasizes an edge of the captured image.

The parameter control unit may control a parameter when at least one of the noise reduction processing or the edge emphasis processing is performed, according to the correction amount.

As the correction amount of a captured image increases, the parameter control unit may perform at least one of processing that increases a degree of noise reduction in the noise reduction processing, or a processing that increases a degree of edge emphasis in the edge emphasis processing.

The signal processing unit may perform the signal processing that includes exposure control processing, and may perform exposure control in such a manner that output values from the plurality of photoelectric-conversion units are not saturated, when the signal processing unit performs the exposure control processing.

A defect correction unit that, to correct an output value from the photoelectric-conversion unit where light polarized by the polarization elements is made to enter, uses output values from surrounding two or more of the photoelectric-conversion units may be further provided.

A capture device that includes the photoelectric-conversion units and an optical system that focuses light on the photoelectric-conversion units may be further provided.

The capture device may be arranged on a side opposite the displaying surface of the displaying unit at substantially a center of the displaying surface.

A defect correction unit that corrects a saturated output value from a photoelectric-conversion unit of the plurality of photoelectric-conversion units, on the basis of polarization information that has been polarized by at least one of the polarization elements arranged around the photoelectric-conversion unit and has been converted from light into electricity by the photoelectric-conversion unit may be further provided.

The photoelectric-conversion units may include a plurality of divided photoelectric-conversion units.

Light polarized by the plurality of polarization elements may be made to enter the plurality of divided photoelectric-conversion units of part of the photoelectric-conversion units.

The photoelectric-conversion units may include a plurality of divided photoelectric-conversion units.

Light polarized by the polarization elements may be made to enter part of the divided photoelectric-conversion units of some of the photoelectric-conversion units.

The photoelectric-conversion units may include a plurality of divided photoelectric-conversion units.

Light polarized by the polarization elements may be made to enter the divided photoelectric-conversion units of parts of two or more of the photoelectric-conversion units.

The plurality of photoelectric-conversion units may include a plurality of divided photoelectric-conversion units.

Light polarized by the plurality of polarization elements may be made to enter the plurality of photoelectric-conversion units.

The photoelectric-conversion units may include a plurality of divided photoelectric-conversion units that is divided in one direction and detects phase difference information.

Light polarized by the polarization elements may be made to enter the plurality of divided photoelectric-conversion units of some of the photoelectric-conversion units.

MODE FOR CARRYING OUT THE INVENTION

Hereinafter, exemplary embodiments of electronic devices will be described with reference to the drawings. Main configuration portions of the electronic devices will be mainly described below. However, configuration portions and functions that are not illustrated or described may exist in the electronic devices. The description below does not exclude configuration portions and functions that are not illustrated or described.

First Exemplary Embodiment

Figure 1:
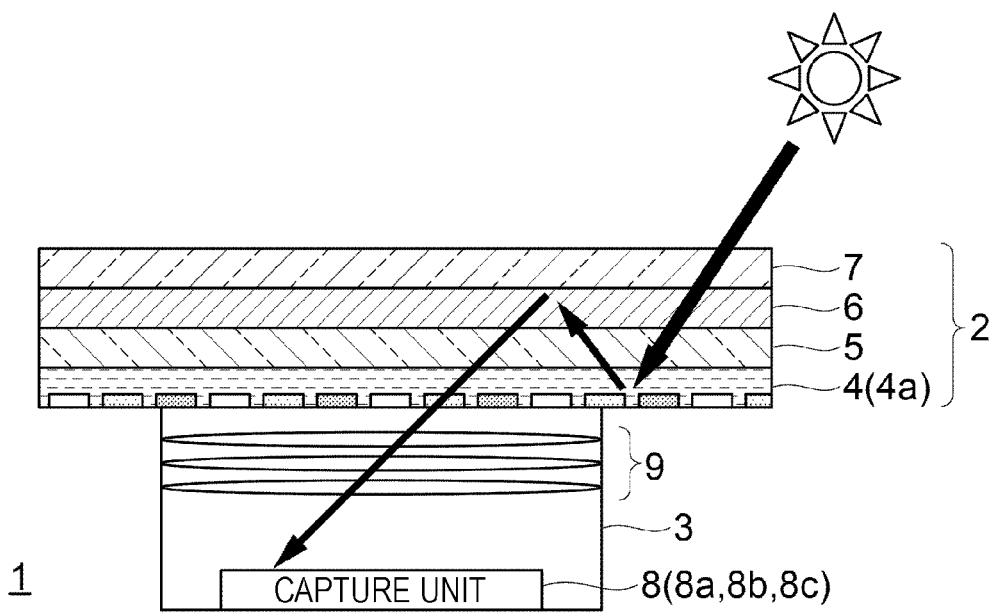
FIG. 1 is a schematic cross-sectional view of an electronic device according to a first exemplary embodiment.

FIG. 1 is a schematic cross-sectional view of an electronic device 1 according to a first exemplary embodiment. The electronic device 1 in FIG. 1 is any electronic device, such as a smartphone, a mobile phone, a tablet, or a personal computer (PC), that includes a displaying function and an imaging function. The electronic device 1 in FIG. 1 includes a camera module (capture unit) arranged on a side opposite a displaying surface of a displaying unit 2. As described above, the electronic device 1 in FIG. 1 includes a camera module 3 on a back side of the displaying surface of the displaying unit 2. Therefore, the camera module 3 performs imaging through the displaying unit 2.

Figures 2A, 2B:
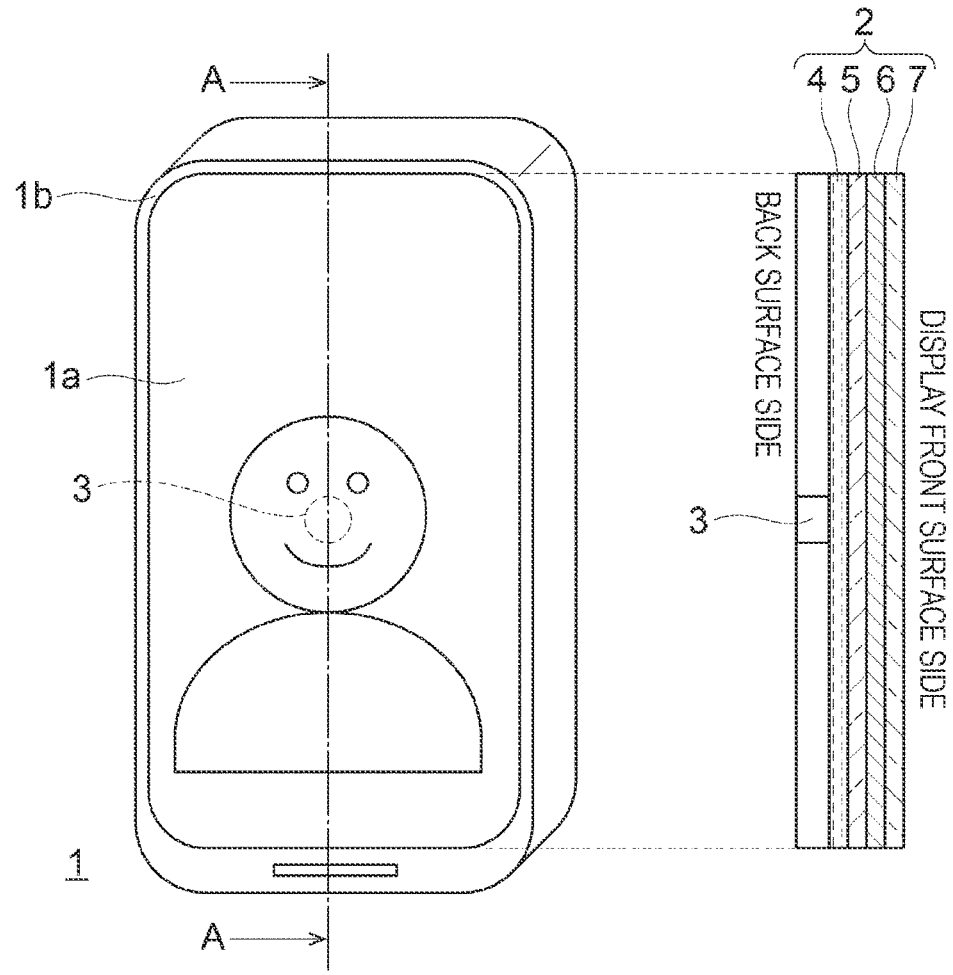
FIG. 2A is a schematic appearance view of the electronic device in FIG. 1.
FIG. 2B is a cross-sectional view in an A-A line direction in FIG. 2A.

FIG. 2A is a schematic appearance view of the electronic device 1 in FIG. 1. FIG. 2B is a cross-sectional view in an A-A line direction in FIG. 2A. In an example in FIG. 2A, a displaying screen 1a expands near an external size of the electronic device 1. A width of a bezel 1b around the displaying screen 1a is several millimeters or less. The bezel 1b is usually equipped with a front camera. However, in FIG. 2A, the camera module 3 that functions as a front camera is arranged on a back surface side of the displaying screen 1a at substantially a center of the displaying screen 1a, as illustrated with a broken line. As described above, a front camera is provided on a back surface side of the displaying screen 1a. A front camera does not need to be arranged in the bezel 1b. A width of the bezel 1b is decreased.

Note that in FIG. 2A, the camera module 3 is arranged on a back surface side of the displaying screen 1a at substantially a center of the displaying screen 1a. However, in the present exemplary embodiment, the camera module 3 is only required to be arranged on a back surface side of the displaying screen 1a. For example, the camera module 3 may be arranged on a back surface side of the displaying screen 1a near a periphery of the displaying screen 1a. As described above, the camera module 3 in the present exemplary embodiment is arranged at any position on a back surface side that is on top of the displaying screen 1a.

As illustrated in FIG. 1, the displaying unit 2 is a structure that includes a displaying panel 4, a circular-polarization sheet 5, a touch panel 6, and a cover glass 7 that are laminated in order. The displaying panel 4 may include, for example, an organic light emitting device (OLED) unit, a liquid-crystal displaying unit, a micro LED, or a displaying unit 2 based on another displaying principle. The displaying panel 4, such as on OLED unit, includes a plurality of layers. The displaying panel 4 often includes a member that has a low transmittance, such as a color filter layer. As described later, a through hole may be formed through a member of the displaying panel 4 that has a low transmittance. The through hole corresponds to a position where the camera module 3 is arranged. If subject light that has passed the through hole is made to enter the camera module 3, an image quality of an image captured by the camera module 3 is increased.

The circular-polarization sheet 5 is provided to decrease glare and increase easiness of seeing the displaying screen 1a in bright circumstances. The touch panel 6 includes a touch sensor. There are various types of touch sensors, such as a capacitive type and a resistive type. However, any type can be used. Furthermore, the touch panel 6 and the displaying panel 4 may be integrated. The cover glass 7 is provided to protect the displaying panel 4 and the like.

The camera module 3 includes a capture unit 8 and an optical system 9. The optical system 9 is arranged on a light entering surface side of the capture unit 8, that is to say a side closer to the displaying unit 2. The optical system 9 focuses light that has passed the displaying unit 2 on the capture unit 8. The optical system 9 usually includes a plurality of lenses.

The capture unit 8 includes a plurality of photoelectric-conversion units 8a and a plurality of polarization elements 8b. The photoelectric-conversion units 8a convert light that has been made to enter through the displaying unit 2 into electricity. The photoelectric-conversion units 8a may be a complementary metal oxide semiconductor (CMOS) sensor or a charge coupled device (CCD) sensor. Furthermore, the photoelectric-conversion units 8a may be a photodiode or an organic photoelectric-conversion film. The plurality of photoelectric-conversion units 8a may be arranged using any method. A method for arranging the plurality of photoelectric-conversion units 8a may be a Bayer arrangement, an interline arrangement, a check arrangement, a stripe arrangement, or another arrangement.

The plurality of polarization elements 8b is arranged on a light entering side of at least one photoelectric-conversion unit 8a of the plurality of photoelectric-conversion units 8a. The polarization elements 8b polarize light that has been made to enter through the displaying unit 2. Light polarized by the polarization elements 8b is made to enter the corresponding photoelectric-conversion units 8a and is converted into electricity. In the present description, output values from the photoelectric-conversion units 8a that convert light polarized by the polarization elements 8b into electricity are referred to as polarization information. Output values from the photoelectric-conversion units 8a that convert light that has been made to enter not through the polarization elements 8b are referred to as pixel values or pixel information. Furthermore, in the present description, combinations of the polarization elements 8b and the photoelectric-conversion units 8a that convert light polarized by the polarization elements 8b into electricity are referred to as polarization pixels. The photoelectric-conversion units 8a that convert light that has been made to enter not through the polarization elements 8b into electricity are referred to as non-polarization pixels.

Figure 3:
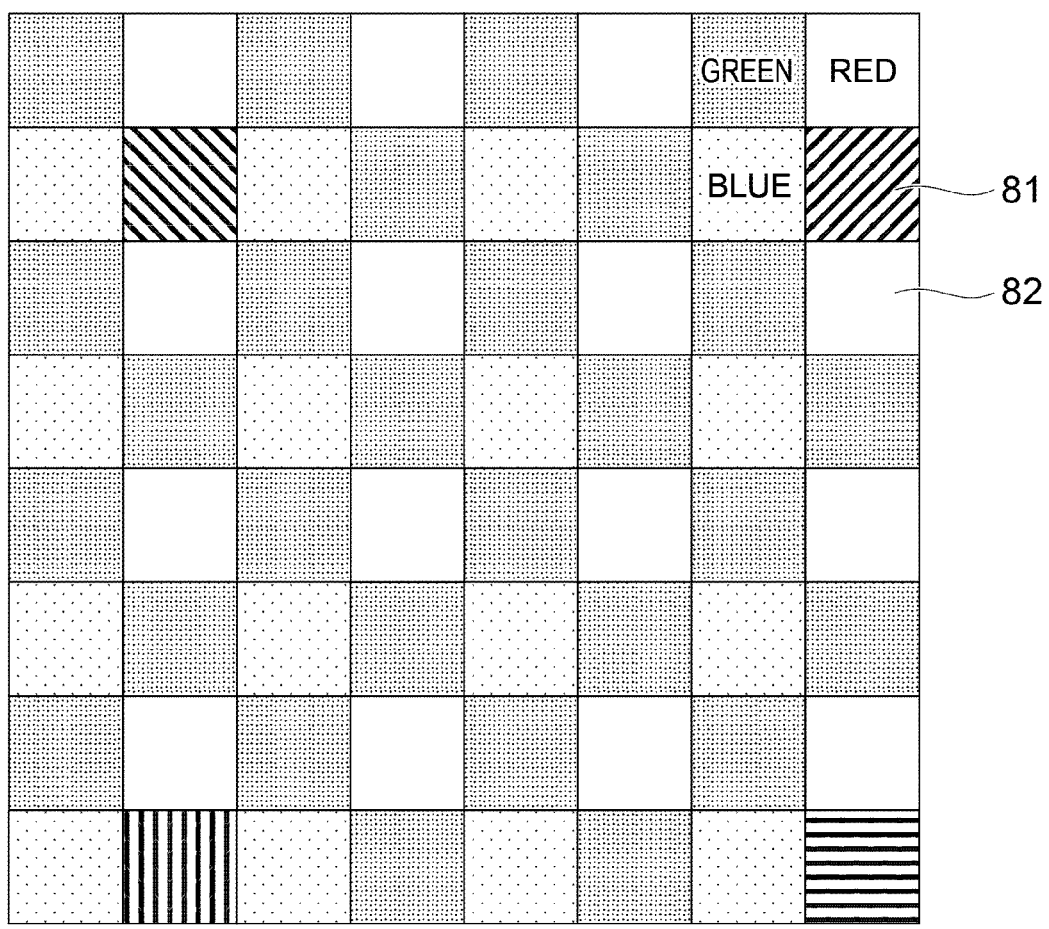
FIG. 3 is a plan view that illustrates an example of a pixel arrangement of a plurality of polarization pixels and a plurality of non-polarization pixels.

FIG. 3 is a plan view that illustrates an example of a pixel arrangement of the plurality of polarization pixels 81 and the plurality of non-polarization pixels 82. In the example in FIG. 3, the plurality of non-polarization pixels 82 for three colors of red, green, and blue (RGB) is arranged in two-dimensional directions. The plurality of polarization pixels 81 is arranged between the plurality of non-polarization pixels 82. The plurality of polarization pixels 81 is separate from each other.

FIG. 3 is a plan view in which the plurality of non-polarization pixels 82 and the plurality of polarization pixels 81 are seen from a light entering side. In the example in FIG. 3, four types of the polarization pixels 81 that have different polarization directions are each arranged in an area where the 8·8=64 non-polarization pixels 82 are arranged. A ratio of the number of the polarization pixels 81 to the number of the non-polarization pixels 82, the types of the polarization pixels 81, and arrangement positions of the polarization pixels 81 are optional.

Figure 4A:
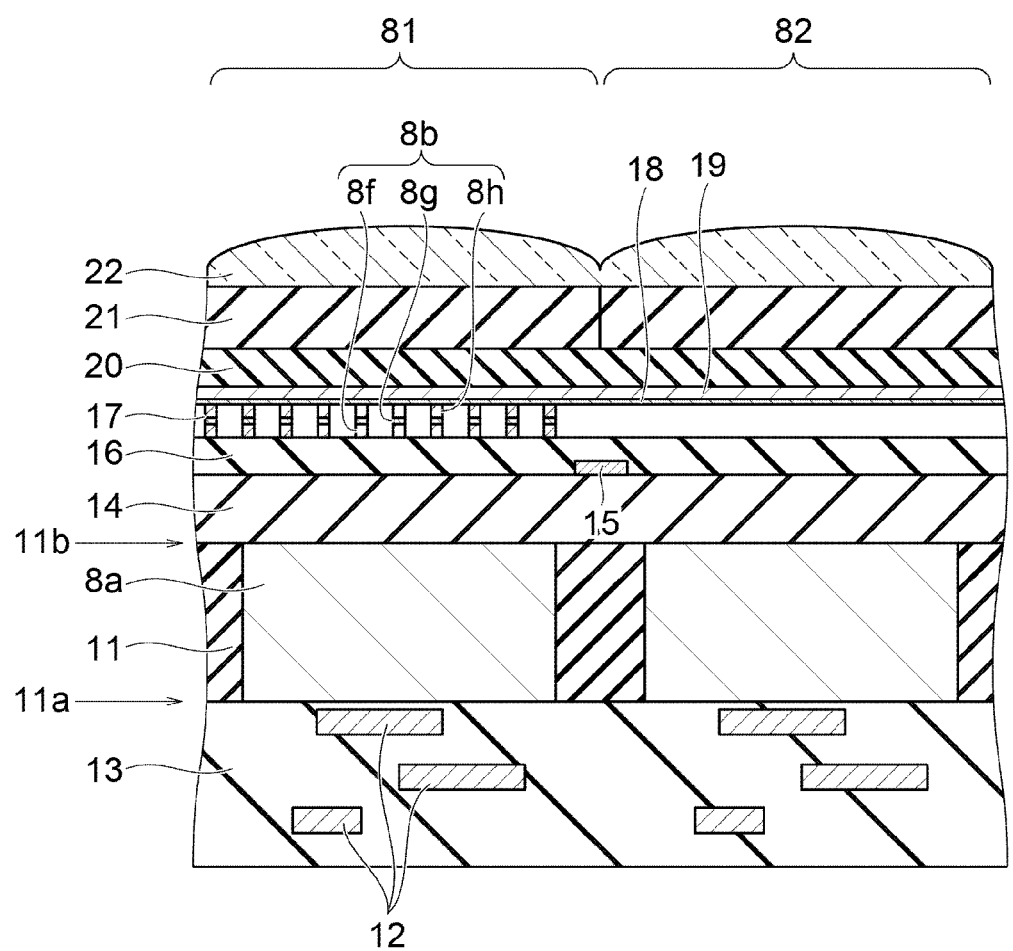
FIG. 4A is a view that illustrates a detailed cross-sectional structure of a capture unit according to the present exemplary embodiment.

FIG. 4A is a view that illustrates a detailed cross-sectional structure of the capture unit 8 according to the present exemplary embodiment. As illustrated in FIG. 4A, the plurality of photoelectric-conversion units 8a is arranged in a board 11. A plurality of wiring layers 12 is arranged on a first surface 11a side of the board 11. An interlayer insulation film 13 is arranged around the plurality of wiring layers 12. Contacts that connect the wiring layers 12 with each other, and contacts that connect the wiring layers 12 with the photoelectric-conversion units 8a are provided but not illustrated. The contacts are omitted in FIG. 4A.

A light shielding layer 15 is arranged on a second surface 11b side of the board 11. A leveling layer 14 is between the light shielding layer 15 and the board 11. The light shielding layer 15 is near a boundary between pixels. A base insulation layer 16 is arranged around the light shielding layer 15. The plurality of polarization elements 8b is arranged on the base insulation layer 16, and are separate. Each of the polarization elements 8b in FIG. 4A is a wire grid polarization element that is arranged in part of the insulation layer 17 and has a line-and-space structure.

Figure 5:
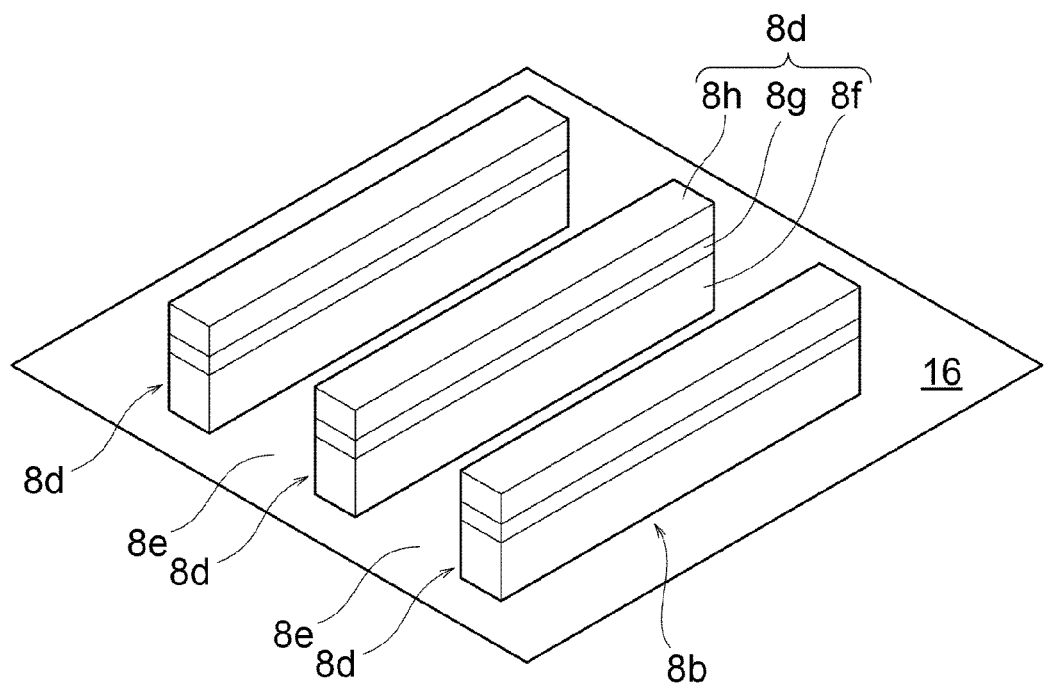
FIG. 5 is a perspective view that illustrates an example of a detailed structure of each of the polarization pixels.

FIG. 5 is a perspective view that illustrates an example of a detailed structure of each of the polarization elements 8b. As illustrated in FIG. 5, each of the plurality of polarization elements 8b includes a plurality of line portions 8d that extend in one direction and have a protruding shape, and a space portion 8e between each of the line portions 8d. There are several types of the polarization elements 8b that have different directions in which the line portions 8d extend. More specifically, there are three or more types of the polarization elements 8b. For example, there may be three types of angles of zero degrees, 60 degrees, and 120 degrees between a direction in which the photoelectric-conversion units 8a are arranged and a direction in which the line portions 8d extend. Alternatively, there may be four types of angles of zero degrees, 45 degrees, 90 degrees, and 135 degrees between a direction in which the photoelectric-conversion units 8a are arranged and a direction in which the line portions 8d extend. Other angles may be possible. Alternatively, the plurality of polarization elements 8b may polarize light into only one direction. Materials of the plurality of polarization elements 8b may include a metal material, such as aluminum or tungsten, or an organic photoelectric-conversion film.

As described above, each of the polarization elements 8b has a structure in which the plurality of line portions 8d that extends in one direction is arranged in a direction that intersects the one direction and is separate. Several types of the polarization elements 8b that have different directions in which the line portions 8d extend exist. The polarization elements 8b are separately arranged on top of part of two-dimensional arrangement of the plurality of photoelectric-conversion units 8a.

The line portions 8d have a laminated structure in which a light reflection layer 8f, an insulation layer 8g, and a light absorption layer 8h are laminated. The light reflection layer 8f includes, for example, a metal material, such as aluminum. The insulation layer 8g includes, for example, SiO2 or the like. The light absorption layer 8h includes, for example, a metal material, such as tungsten.

Returning to FIG. 4A, a leveling layer 20 is arranged over the insulation layer 17 in which the plurality of polarization elements 8b is arranged. Protection layers 18 and 19 are between the leveling layer 20 and the insulation layer 17. A color filter layer 21 is arranged on the leveling layer 20. The color filter layer 21 may include a filter layer for three colors of RGB, or may include a filter layer for cyan, magenta, and yellow that are complementary colors for RGB Alternatively, the color filter layer 21 may include a filter layer that transmits colors except visible light, such as infrared light, may include a filter layer that has a multispectral characteristic, or may include a filter layer for a decreased color, such as white. Since light except visible light, such as infrared light, is transmitted, sensing information, such as depth information, can be detected. An on-chip lens 22 is arranged on the color filter layer 21.

Figure 4B:
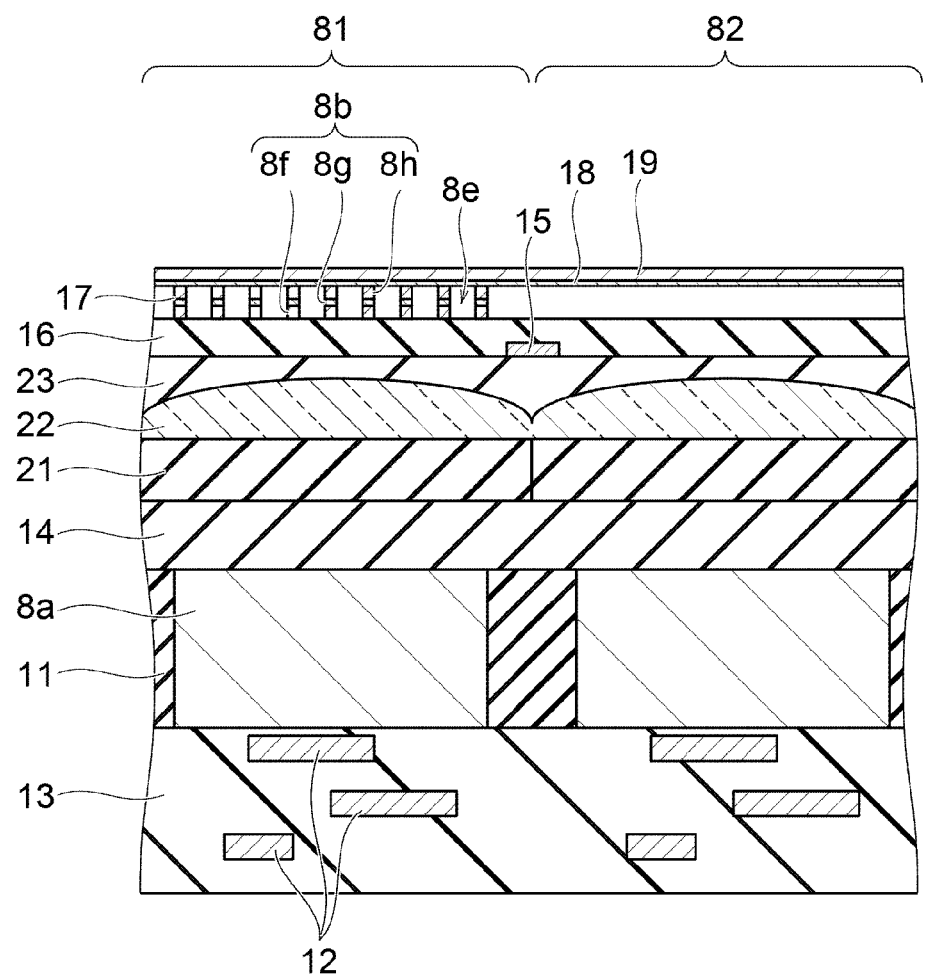
FIG. 4B is a cross-sectional view of a case where a plurality of polarization pixels is arranged over an on-chip lens.

In a cross-sectional structure in FIG. 4A, the on-chip lens 22 is arranged over the plurality of polarization elements 8b. However, the plurality of polarization elements 8b may be arranged over the on-chip lens 22, as illustrated in FIG. 4B. A cross-sectional structure in FIG. 4B is similar to FIG. 4A except a laminating order of the on-chip lens 22 and the plurality of polarization elements 8b.

Furthermore, a layer configuration of part of the cross-sectional structures in FIG. 4A and FIG. B may be optionally changed. For example, the insulation layer 16 in which the plurality of polarization elements 8b is arranged in FIG. 4A and the color filter layer 21 may be integrated into one layer.

Figure 6A:
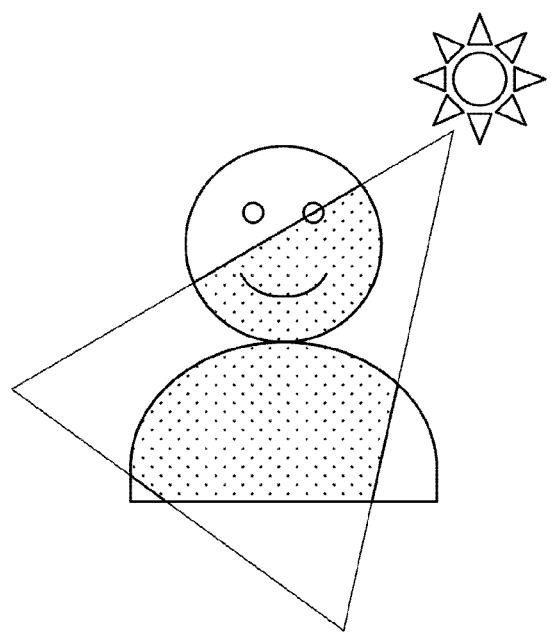
FIG. 6A is a diagram that schematically illustrates a state in which a flare occurs when a subject is imaged with the electronic device in FIG. 1.

Next, characteristic operations of the electronic device 1 according to the present exemplary embodiment will be described. FIG. 6A is a diagram that schematically illustrates a state in which a flare occurs when a subject is imaged with the electronic device 1 in FIG. 1. A flare occurs because part of light that has been made to enter the displaying unit 2 of the electronic device 1 is repeatedly reflected by some members in the displaying unit 2, and then is made to enter the capture unit 8, and appears in a captured image. If a flare occurs in a captured image, a luminance difference or a hue change occurs, and an image quality decreases, as illustrated in FIG. 6A.

Figure 6B:
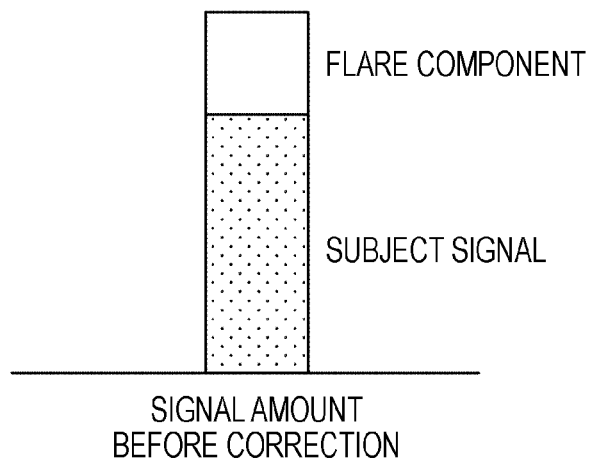
FIG. 6B is a diagram that illustrates signal components contained in a captured image in FIG. 6A.

FIG. 6B is a diagram that illustrates signal components contained in the captured image in FIG. 6A. As illustrated in FIG. 6B, the imaged image contains a subject signal and a flare component.

Figure 7A:
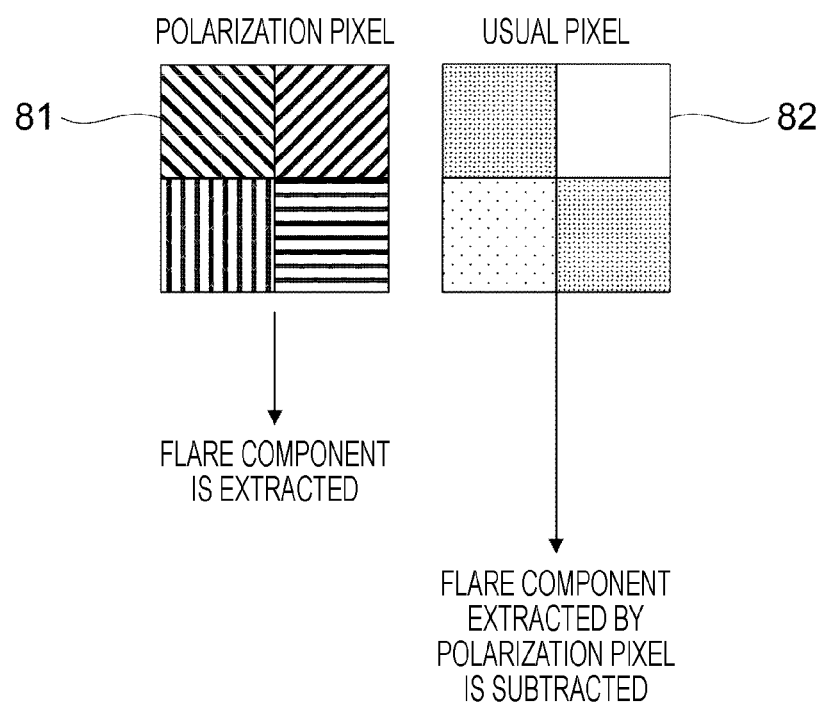
FIG. 7A is a diagram that conceptually illustrates correction processing according to the present exemplary embodiment.
Figure 7B:
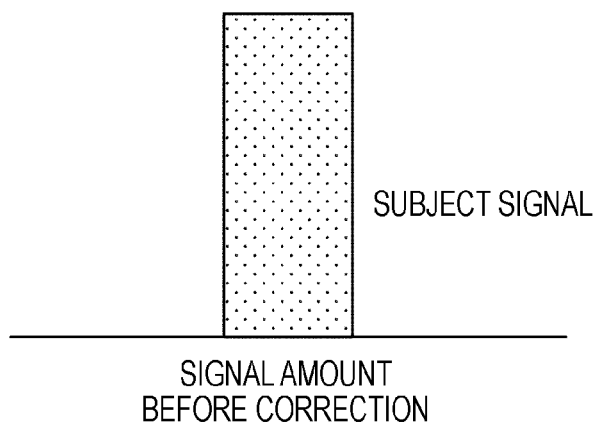
FIG. 7B is a diagram that conceptually illustrates correction processing according to the present exemplary embodiment.
Figure 7C:
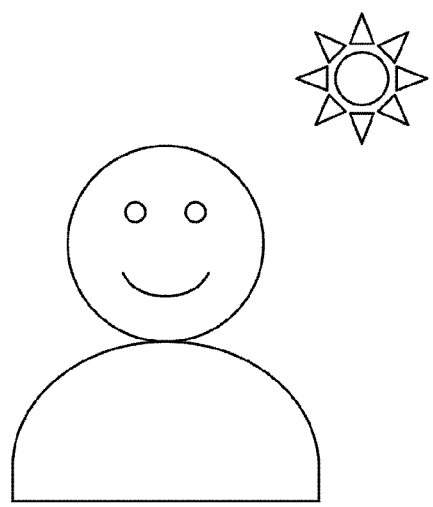
FIG. 7C is a diagram that conceptually illustrates correction processing according to the present exemplary embodiment.

FIGS. 7A, 7B, and 7C are diagrams that conceptionally illustrate correction processing according to the present exemplary embodiment. As illustrated in FIG. 7A, the capture unit 8 according to the present exemplary embodiment includes the plurality of polarization pixels 81 and the plurality of non-polarization pixels 82. Pixel information converted from light into electricity by the plurality of non-polarization pixels 82 illustrated in FIG. 7A contains a subject signal and a flare component, as illustrated in FIG. 6B. On the other hand, polarization information converted from light into electricity by the plurality of polarization pixels 81 illustrated in FIG. 7A is information about a flare component. Therefore, polarization information that has been converted from light into electricity by the plurality of polarization pixels 81 is subtracted from pixel information that has been converted from light into electricity by the plurality of non-polarization pixels 82 to remove the flare component and obtain the subject signal, as illustrated in FIG. 7B. If an image based on the subject signal is displayed on the displaying unit 2, a subject image from which the flare that exists in FIG. 6A is removed is displayed, as illustrated in FIG. 7C.

FIGS. 6A to 6B and 7A to 7C illustrate an example where a flare affects a subject image. However, external light that has been made to enter the displaying unit 2 may be diffracted by a wiring pattern and the like in the displaying unit 2, and the diffracted light may be made to enter the capture unit 8. As described above, there is a possibility that at least one of a flare or diffracted light appears in a captured image.

Figure 8:
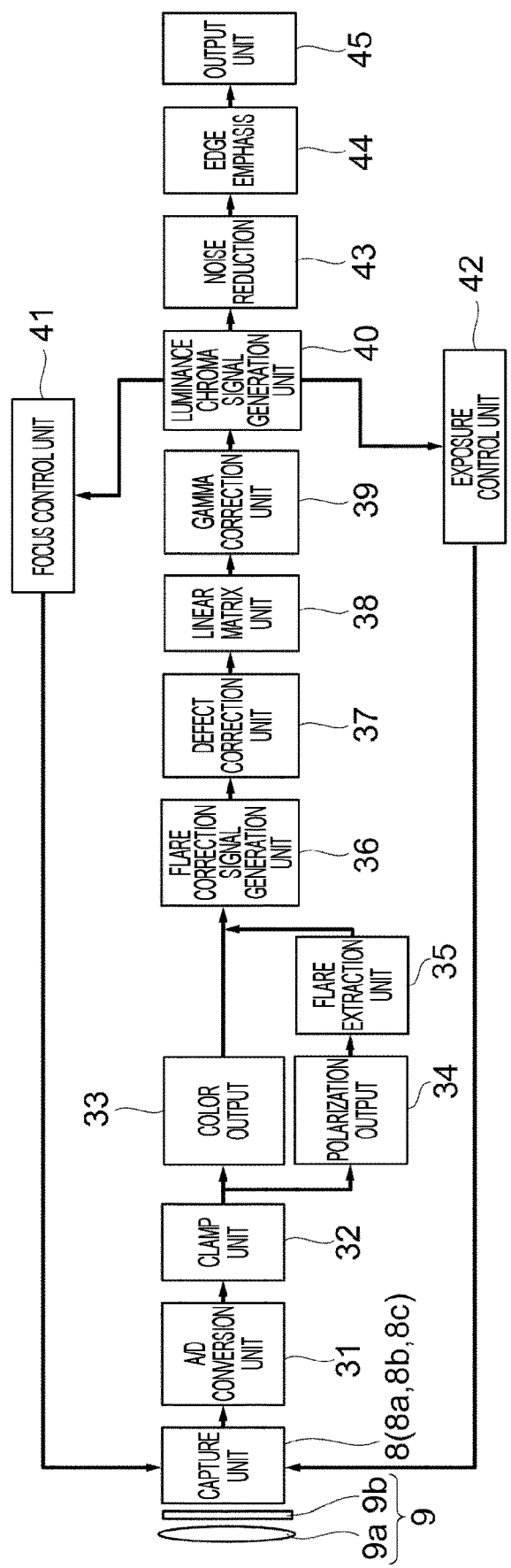
FIG. 8 is a block diagram that illustrates an internal configuration of the electronic device according to the present exemplary embodiment.

FIG. 8 is a block diagram that illustrates an internal configuration of the electronic device 1 according to the present exemplary embodiment. The electronic device 1 in FIG. 8 includes the optical system 9, the capture unit 8, an analog/digital (A/D) converter 31, a clamp unit 32, a color output unit 33, a polarization output unit 34, a flare extraction unit 35, a flare correction signal generation unit 36, a defect correction unit 37, a linear matrix unit 38, a gamma correction unit 39, a luminance chroma signal generation unit 40, a focus adjustment unit 41, an exposure control unit 42, a noise reduction unit 43, an edge emphasis unit 44, and an output unit 45.

The optical system 9 includes at least one lens 9a and an infrared-ray (IR) cut-off filter 9b. The IR cut-off filter 9b may be omitted. As described above, the capture unit 8 includes the photoelectric-conversion units 8a that include the plurality of non-polarization pixels 82, and the plurality of polarization pixels 81.

Output values from the plurality of polarization pixels 81 and output values from the plurality of non-polarization pixels 82 are input into the A/D converter 31. The A/D converter 31 outputs polarization information data that includes the output values from the plurality of polarization pixels 81 that have been digitalized, and digital pixel data that includes the output values from the plurality of non-polarization pixels 82 that have been digitalized.

The clamp unit 32 performs processing that defines a level of black. The clamp unit 32 subtracts black level data from each of the digital pixel data and the polarization information data. Output data from the clamp unit 32 branches. The digital pixel data of RGB is output from the color output unit 33. The polarization information data is output from the polarization output unit 34. The flare extraction unit 35 extracts at least one of a flare component or a diffracted-light component from the polarization information data. In the present description, at least one of a flare component or a diffracted-light component extracted from the flare extraction unit 35 may be referred to as a correction amount.

The flare correction signal generation unit 36 performs subtraction processing of the correction amount extracted by the flare extraction unit 35, to the digital pixel data output from the color output unit 33, and thus corrects the digital pixel data. Output data from the flare correction signal generation unit 36 includes the digital pixel data from which at least one of the flare component or the diffracted-light component is removed. As described above, the flare correction signal generation unit 36 functions as a correction unit that corrects a captured image that has been converted from light into electricity by the plurality of non-polarization pixels 82, on the basis of polarization information.

Digital pixel data at pixel positions of the polarization pixels 81 have low signal levels due to passing the polarization elements 8b. Therefore, the defect correction unit 37 regards the polarization pixels 81 as a defect, and performs a predetermined defect correction processing. The defect correction processing in this case may include processing that interpolates using digital pixel data at surrounding pixel positions.

The linear matrix unit 38 performs a matrix operation for color information, such as RGB, to reproduce colors more correctly. The linear matrix unit 38 may also be referred to as a color matrix unit.

The gamma correction unit 39 performs a gamma correction to allow display that is very easy to see, according to a display characteristic of the displaying unit 2. For example, the gamma correction unit 39 performs a conversion from ten bits to eight bits while changing an inclination.

The luminance chroma signal generation unit 40 generates a luminance chroma signal on the basis of output data from the gamma correction unit 39. The luminance chroma signal is for being displayed on the displaying unit 2.

The focus adjustment unit 41 performs autofocus processing on the basis of the luminance chroma signal after the defect correction processing is performed. The exposure control unit 42 performs exposure control on the basis of the luminance chroma signal after the defect correction processing is performed. When the exposure control is performed, an upper-limit clip is set not to allow a pixel value of each of the non-polarization pixels 82 to be saturated, and the exposure control is performed. Furthermore, in a case where a pixel value of each of the non-polarization pixels 82 is saturated even if exposure control is performed, pixel values of the non-polarization pixels 82 that have been saturated may be estimated on the basis of pixel values of the polarization pixels 81 around the non-polarization pixels 82.

The noise reduction unit 43 performs processing that reduces noise contained in the luminance chroma signal. The edge emphasis unit 44 performs processing that emphasizes an edge of a subject image on the basis of the luminance chroma signal. The noise reduction processing by the noise reduction unit 43 and the edge emphasis processing by the edge emphasis unit 44 may be performed only in a case where a predetermined condition is satisfied. The predetermined condition includes, for example, a case where a correction amount of a flare component or a diffracted-light component extracted by the flare extraction unit 35 exceeds a predetermined threshold. As a flare component or a diffracted-light component contained in a captured image increase, noise increases in an image at a time when the flare component or the diffracted-light component is removed, and an edge blurs. Therefore, only in a case where a correction amount exceeds a threshold, the noise reduction processing and the edge emphasis processing are performed. Consequently, a frequency with which the noise reduction processing and the edge emphasis processing are performed is decreased.

At least part of signal processing by the defect correction unit 37, the linear matrix unit 38, the gamma correction unit 39, the luminance chroma signal generation unit 40, the focus adjustment unit 41, the exposure control unit 42, the noise reduction unit 43, and the edge emphasis unit 44 in FIG. 8 may be performed by a logic circuit in a capture sensor that includes the capture unit 8, or may be performed by a signal processing circuit in the electronic device 1 equipped with a capture sensor. Alternatively, at least part of the signal processing in FIG. 8 may be performed by a server or the like on a cloud that transmits and receives information to and from the electronic device 1 through a network. As illustrated in the block diagram in FIG. 8, the electronic device 1 according to the present exemplary embodiment performs various signal processing to digital pixel data from which the flare correction signal generation unit 36 has removed at least one of a flare component or a diffracted-light component. The reason is that even if part of signal processing, such as exposure processing, focus adjustment processing, and white balance control processing, is performed with a flare component or a diffracted-light component contained, a good signal processing result is not obtained.

Figure 9:
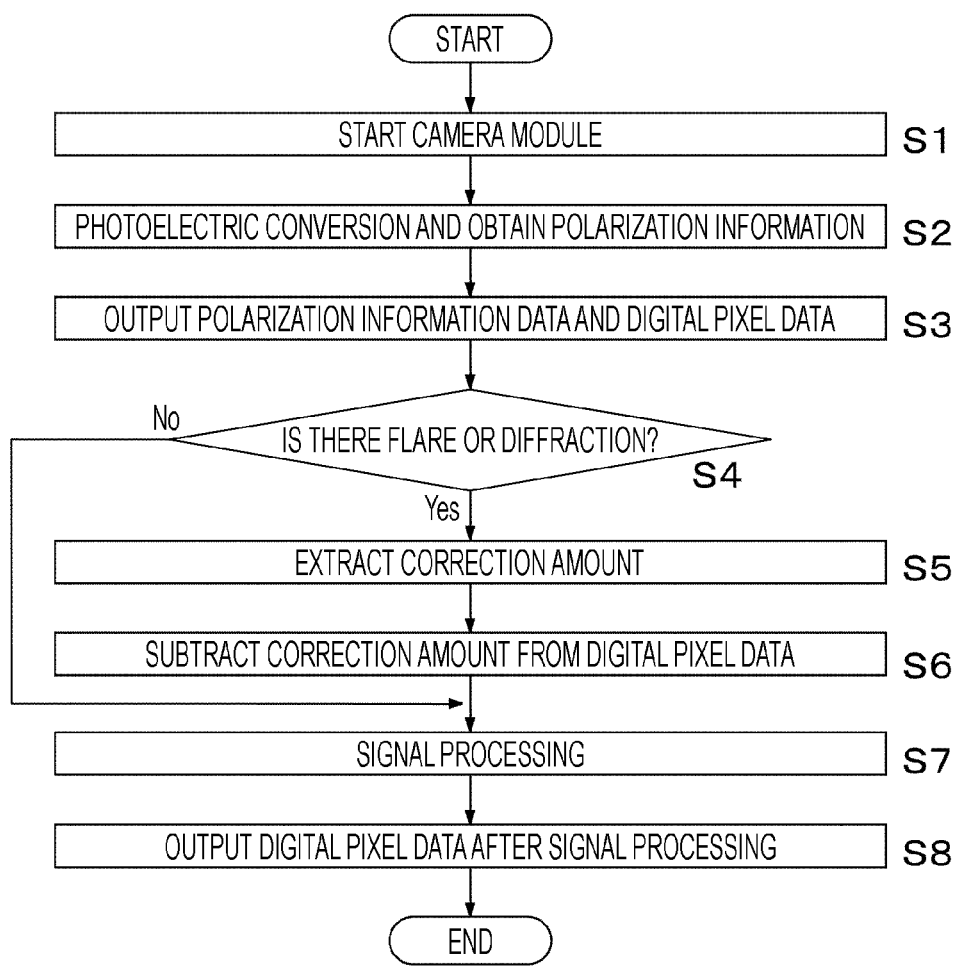
FIG. 9 is a flowchart that illustrates processing steps of imaging processing performed by the electronic device according to the present exemplary embodiment.

FIG. 9 is a flowchart that illustrates processing steps of imaging processing performed by the electronic device 1 according to the present exemplary embodiment. First, the camera module 3 is started (step S1). Therefore, a power source voltage is supplied to the capture unit 8, and the capture unit 8 starts to capture entering light. More specifically, the plurality of non-polarization pixels 82 converts entering light into electricity, and the plurality of polarization pixels 81 obtains polarization information of the entering light (step S2). The A/D converter 31 outputs polarization information data that includes output values from the plurality of polarization pixels 81 that have been digitalized, and digital pixel data that includes output values from the plurality of non-polarization pixels 82 that have been digitalized (step S3).

Next, on the basis of the polarization information data, the flare extraction unit 35 determines whether or not a flare or diffraction occurs (step S4). Here, it is determined that a flare or diffraction occurs if, for example, the polarization information data exceeds a predetermined threshold. If it is determined that a flare or diffraction occurs, the flare extraction unit 35 extracts a correction amount of a flare component or a diffracted-light component on the basis of the polarization information data (step S5). The flare correction signal generation unit 36 subtracts the correction amount from the digital pixel data, and generates digital pixel data from which the flare component or the diffracted-light component has been removed (step S6).

Next, various signal processing is performed to the digital pixel data corrected in step S6, or is performed to the digital pixel data that receives determination that a flare or diffraction does not occur in step S4 (step S7). More specifically, in step S7, defect correction processing, linear matrix processing, gamma correction processing, luminance chroma signal generation processing, exposure processing, focus adjustment processing, white balance control processing, noise reduction processing, edge emphasis processing, and the like are performed, as illustrated in FIG. 8. Note that types and a performing order of the signal processing are optional. Signal processing in part of the blocks illustrated in FIG. 8 may be omitted. Signal processing except the blocks illustrated in FIG. 8 may be performed. The digital pixel data to which the signal processing is performed in step S7 is output from the output unit 45, may be stored in memory not illustrated, or may be displayed as a live image on the displaying unit 2 (step S8).

As described above, in the first exemplary embodiment, the camera module 3 is arranged on a side opposite the displaying surface of the displaying unit 2, and the plurality of polarization pixels 81 obtains polarization information of light that passes the displaying unit 2. Part of light that passes the displaying unit 2 is repeatedly reflected in the displaying unit 2, and is made to enter the plurality of non-polarization pixels 82 in the camera module 3.

According to the present exemplary embodiment, the polarization information described above is obtained. Therefore, a captured image in a state where a flare component or a diffracted-light component that is contained in light that is repeatedly reflected in the displaying unit 2 and is made to enter the plurality of non-polarization pixels 82 is easily and surely removed is generated. More specifically, in the present exemplary embodiment, subtraction processing of a correction amount based on polarization information obtained by the plurality of polarization pixels 81 is performed to digital pixel data captured by the plurality of non-polarization pixels 82 that converts light that has been made to enter not though the polarization elements 8b into electricity, and converted from analog to digital. Consequently, digital pixel data from which a flare component or a diffracted-light component has been removed is generated.

Second Exemplary Embodiment

The flare correction signal generation unit 36 in FIG. 8 performs subtraction processing of a correction amount based on polarization information obtained by the plurality of polarization pixels 81, to digital pixel data captured by the plurality of non-polarization pixels 82. However, due to the subtraction processing, there is a possibility that a signal-to-noise (S/N) ratio of the digital pixel data after the subtraction deteriorates. This is because light shot noise superimposed on a flare component cannot be removed with the subtraction processing described above.

Therefore, a noise reduction degree of noise reduction processing may be controlled according to a correction amount based on a flare component or a diffracted-light component. More specifically, as a correction amount increases, a noise reduction degree of noise reduction processing is increased. Furthermore, in a case where increasing a noise reduction degree of noise reduction processing makes an edge obscure, an edge emphasis degree of edge emphasis processing may be increased.

Figure 10:
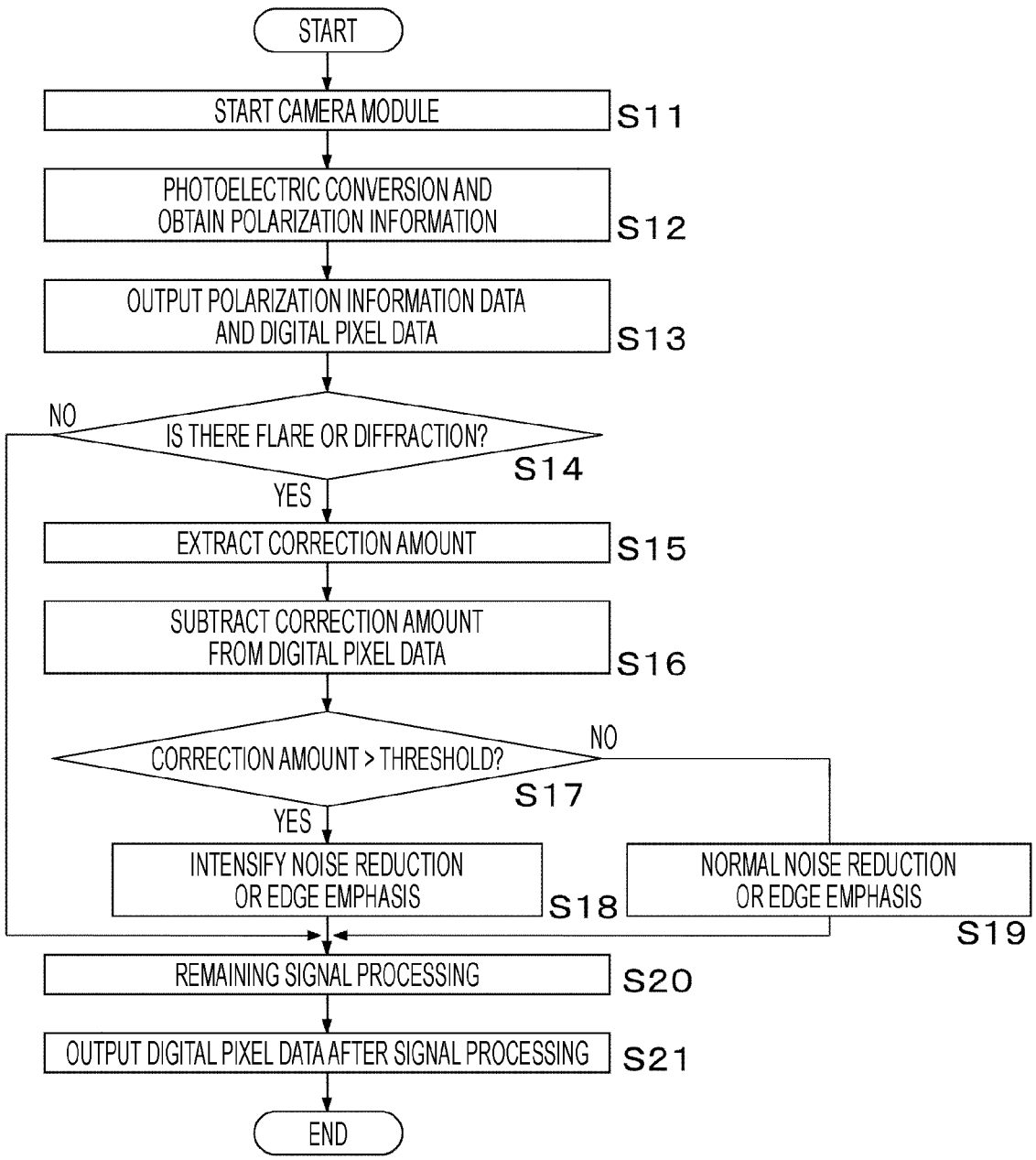
FIG. 10 is a flowchart that illustrates processing steps of imaging processing performed by an electronic device according to the present exemplary embodiment.

FIG. 10 is a flowchart that illustrates processing steps of imaging processing performed by an electronic device 1 according to the present exemplary embodiment. The processing from steps S11 to S16 is similar to steps S1 to S6 in FIG. 9, and thus the description will be omitted. If processing that subtracts a correction amount from digital pixel data ends in step S16, then it is determined whether or not the correction amount extracted in step S14 exceeds a predetermined threshold (step S17). If it is determined that the correction amount exceeds the threshold, at least one of a noise reduction degree of noise reduction processing or an edge emphasis degree of edge emphasis processing is increased (step S18). That is to say, in a case where the correction amount of a flare component or a diffracted-light component is large, the noise reduction degree is increased, or processing that emphasizes an edge more is performed. Therefore, even if subtracting the correction amount from the digital pixel data decreases an S/N ratio, the noise reduction processing or the edge emphasis processing is appropriately performed, and the decrease in the S/N ratio is restricted.

On the other hand, if it is determined that the correction amount does not exceed the threshold, normal noise reduction processing or edge emphasis processing is performed (step S19).

In a case where it is determined in step S14 that a flare or diffraction does not occur, or in a case where the processing in step S18 ends, or in a case where the processing in step S19 ends, other signal processing is performed (step S20). If all signal processing ends, digital pixel data is output (step S21).

FIG. 10 illustrates an example where in a case where a correction amount exceeds a threshold, degrees of noise reduction processing and edge emphasis processing are increased. Concrete contents of any signal processing except the noise reduction processing and the edge emphasis processing may be switched between a case where the correction amount exceeds a threshold and a case where the correction amount does not exceed the threshold. In this case, a parameter control unit may be provided. According to a correction amount, the parameter control unit controls parameters when any signal processing is performed. Because it is conceivable that, according to contents of signal processing, control amounts of the parameters vary, the parameter control unit may set optimum parameters for every unit that performs each signal processing, according to a correction amount. Note that in the above example, the noise reduction unit 43 and the edge emphasis unit 44 function as the parameter control units. The noise reduction unit 43 controls parameters that determine a noise reduction degree. The edge emphasis unit 44 controls parameters that determine an edge emphasis degree.

Furthermore, in steps S17 to S19 in FIG. 10, degrees of the noise reduction processing and the edge emphasis processing are switched between two ways, depending on whether or not a correction amount exceeds a threshold. However, degrees to which the noise reduction processing and the edge emphasis processing are performed are finely switched between three or more stages, according to a correction amount of a flare component or a diffracted-light component, or a state of a subject, or the like.

As described above, in the second exemplary embodiment, a correction amount based on a flare component or a diffracted-light component is subtracted from digital pixel data. Consequently, in a case where there is a possibility that an S/N ratio of digital pixel data after the subtraction decreases, processing that increases a noise reduction degree more or an edge emphasis degree more is performed. Therefore, even in a case where a flare component or a diffracted-light component is removed, there is no possibility that an S/N ratio of a captured image decreases.

Third Exemplary Embodiment

In a third exemplary embodiment, each of pixels has a divided structure.

Figure 11:
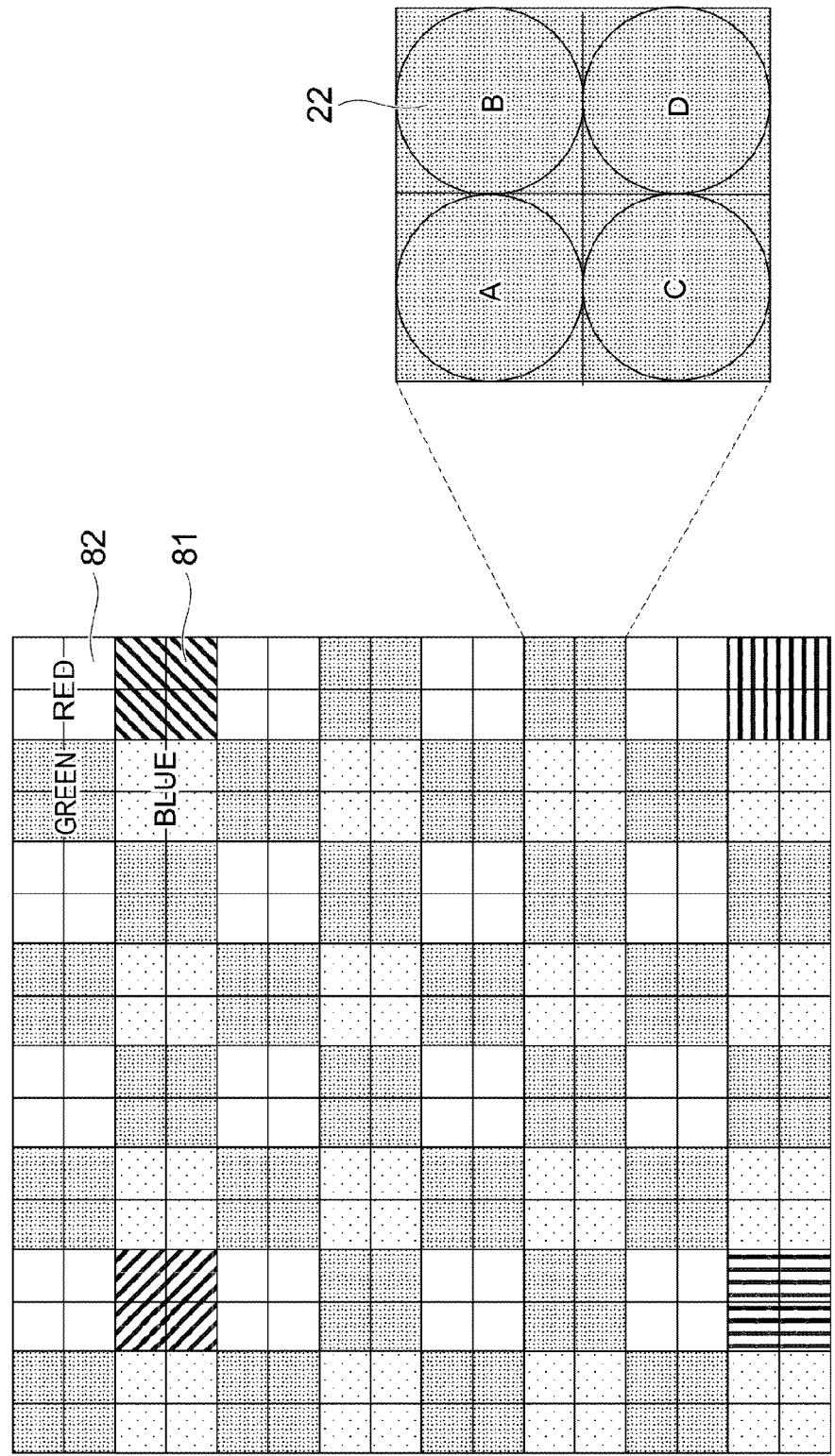
FIG. 11 is a plan view that illustrates an example of a pixel arrangement of a plurality of polarization pixels and a plurality of non-polarization pixels according to a third exemplary embodiment.

FIG. 11 is a plan view that illustrates an example of a pixel arrangement of a plurality of polarization pixels 81 and a plurality of non-polarization pixels 82 according to the third exemplary embodiment. As illustrated in FIG. 11, each of the polarization pixels 81 and each of the non-polarization pixels 82 are divided into four. More specifically, each of photoelectric-conversion units 8a includes a plurality of divided photoelectric-conversion units. Light polarized by a plurality of polarization elements 8b is made to enter a plurality of divided photoelectric-conversion units of part of the photoelectric-conversion units 8a. Note that FIG. 11 illustrates an example where each of the polarization pixels 81 and each of the non-polarization pixels 82 are divided into four. However, each of the polarization pixels 81 and each of the non-polarization pixels 82 may be divide into any number that is at least two.

The plurality of polarization pixels 81 is arranged and corresponds to positions and a size of the plurality of non-polarization pixels 82. In the example in FIG. 11, a ratio of the non-polarization pixels 82 to the polarization pixels 81 arranged in lateral and vertical directions is five to one. Each of the polarization pixels 81 is divided into four, similarly as each of the non-polarization pixels 82. Four divided pixels in the same polarization pixel 81 have the same polarization pattern. In the example in FIG. 11, four types of the polarization pixels 81 that have different polarization patterns are provided. However, as long as types of the polarization pixels 81 are three or more types, the number of the types is optional. In the present description, each of four pixels into which each of the polarization pixels 81 or each of the non-polarization pixels 82 is divided is referred to as a divided pixel.

Four divided pixels that constitute each of the non-polarization pixels 82 may be separately provided with an on-chip lens 22, as illustrated in an enlarged view on the right in FIG. 11.

In the example in FIG. 11, a size of each of the polarization pixels 81 is the same as a size of each of the non-polarization pixels 82, and each of the polarization pixels 81 is arranged according to a position where each of the non-polarization pixels 82 is arranged. However, a size of each of the polarization pixels 81 or a position where each of the polarization pixels 81 is arranged may be different from a size of each of the non-polarization pixels 82 or a position where each of the non-polarization pixels 82 is arranged.

In a case in FIG. 11, light input into a pixel area in the photoelectric-conversion units 8a assigned as the polarization pixels 81 is polarized by the corresponding polarization elements 8b. Therefore, output values from the photoelectric-conversion units 8a in the pixel area are small. Therefore, a defect correction unit 37 illustrated in FIG. 8 needs to use output values from the non-polarization pixels 82 around each of the polarization elements 8b to perform a defect correction that corrects output values from the polarization pixels 81.

Figure 12:
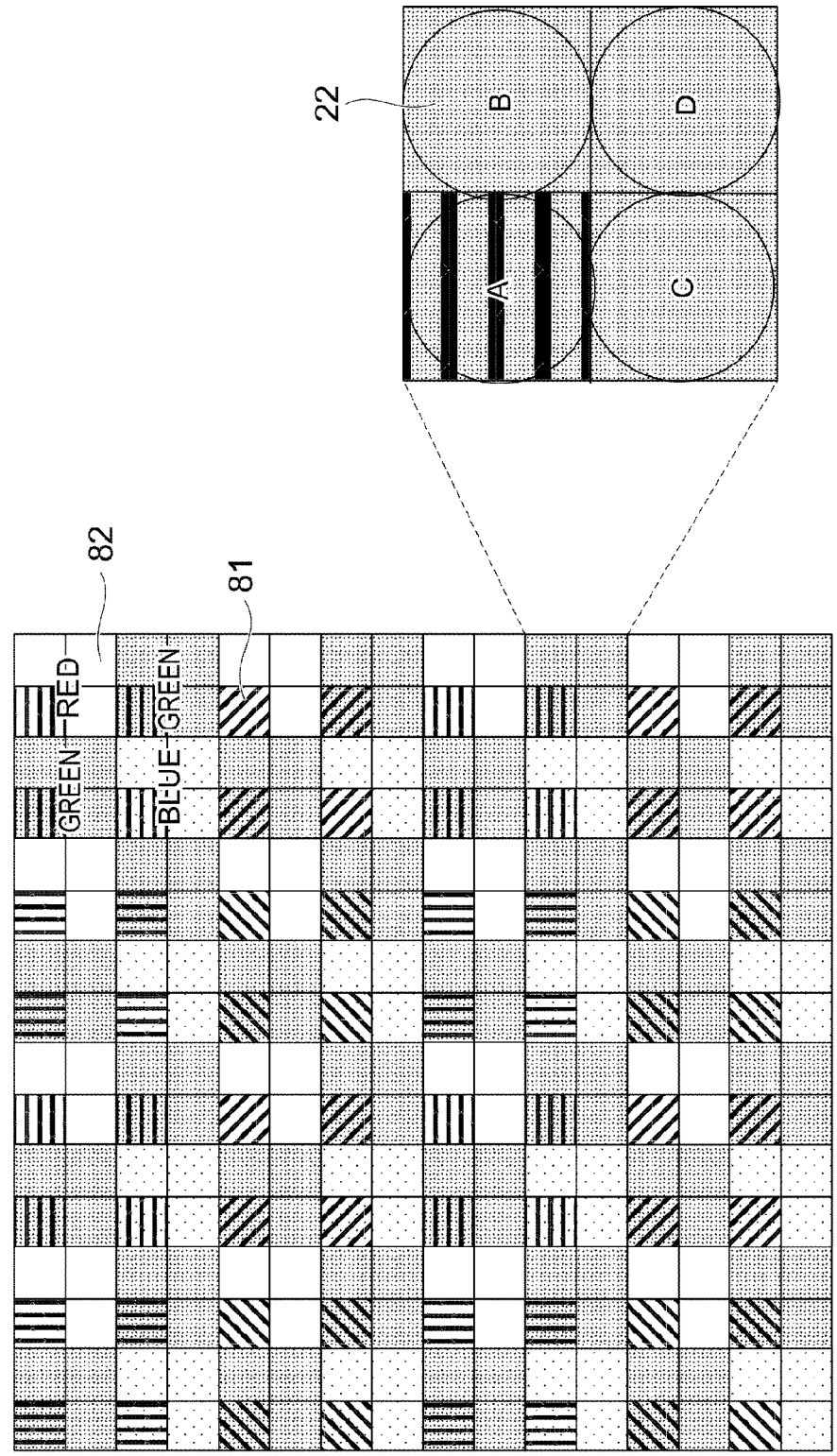
FIG. 12 is a plan view that illustrates a first variation example of a divided structure.

FIG. 12 is a plan view that illustrates a first variation example of the divided structure. In FIG. 12, three of four divided pixels that constitute one pixel are used for photoelectric conversion of corresponding non-polarization pixels 82. The remaining one is used as a polarization pixel 81. More specifically, a photoelectric-conversion unit 8a includes a plurality of divided photoelectric-conversion units. Light polarized by a plurality of polarization elements 8b is made to enter part of divided photoelectric-conversion units of some photoelectric-conversion units 8a. Therefore, a polarization pixel 81 and non-polarization pixels 82 are partly arranged in each of pixels. In this case, four divided pixels that constitute one pixel are each provided with a corresponding on-chip lens, as illustrated in an enlarged view on the right in FIG. 12.

In the example in FIG. 11, a ratio of the plurality of non-polarization pixels 82 to the polarization pixels 81 that are provided is a plural number to one. However, in the example in FIG. 12, non-polarization pixels 82 and a polarization pixel 81 are provided for each pixel. Therefore, polarization information in the photoelectric-conversion units 8a is more correctly obtained in the example in FIG. 12 than the example in FIG. 11.

Furthermore, in the example in FIG. 12, four types of the polarization pixels 81 that have four types of polarization patterns are uniformly arranged. However, types of polarization patterns are only required to be three types or more, and are not limited to four types.

In a case in FIG. 12, a pixel output value is determined for each pixel on the basis of output values from divided photoelectric-conversion units of three divided pixels used as non-polarization pixels 82 of vertically two and laterally two divided pixels, and a correction amount is determined for every pixel on the basis of an output value from a divided photoelectric-conversion unit of one divided pixel used as a polarization pixel 81 of vertically two and laterally two divided pixels. As described above, in the example in FIG. 12, part of each pixel includes a non-polarization pixel 82. Therefore, a defect correction does not need to be performed, and signal processing is simplified.

As described above, a polarization pixel 81 and non-polarization pixels 82 are assigned to a plurality of divided pixels into which each pixel is divided. Non-polarization pixels 82*c* in each pixel output color information and polarization information, and resolution is not lost. Therefore, defect correction processing is not necessary. Furthermore, a correction amount based on a flare component or a diffracted-light component can be calculated due to a polarization pixel 81 assigned to part of each pixel. The correction amount is subtracted from digital pixel data to remove the flare component or the diffracted-light component from a captured image.

In the example in FIG. 12, a polarization pixel 81 is assigned to one of four divided pixels into which each pixel is divided. Therefore, a size of the polarization pixel 81 is very small. As illustrated in FIG. 5, the polarization pixel 81 is configured with, for example, line-and-space portions. However, it is difficult to accurately make uniform shapes of the line portions 8*d* and uniform gaps between two adjacent line portions 8*d* by using fine processing technique. Therefore, a size of the polarization pixels 81 may be made larger than a size of the non-polarization pixels 82.

Figure 13:
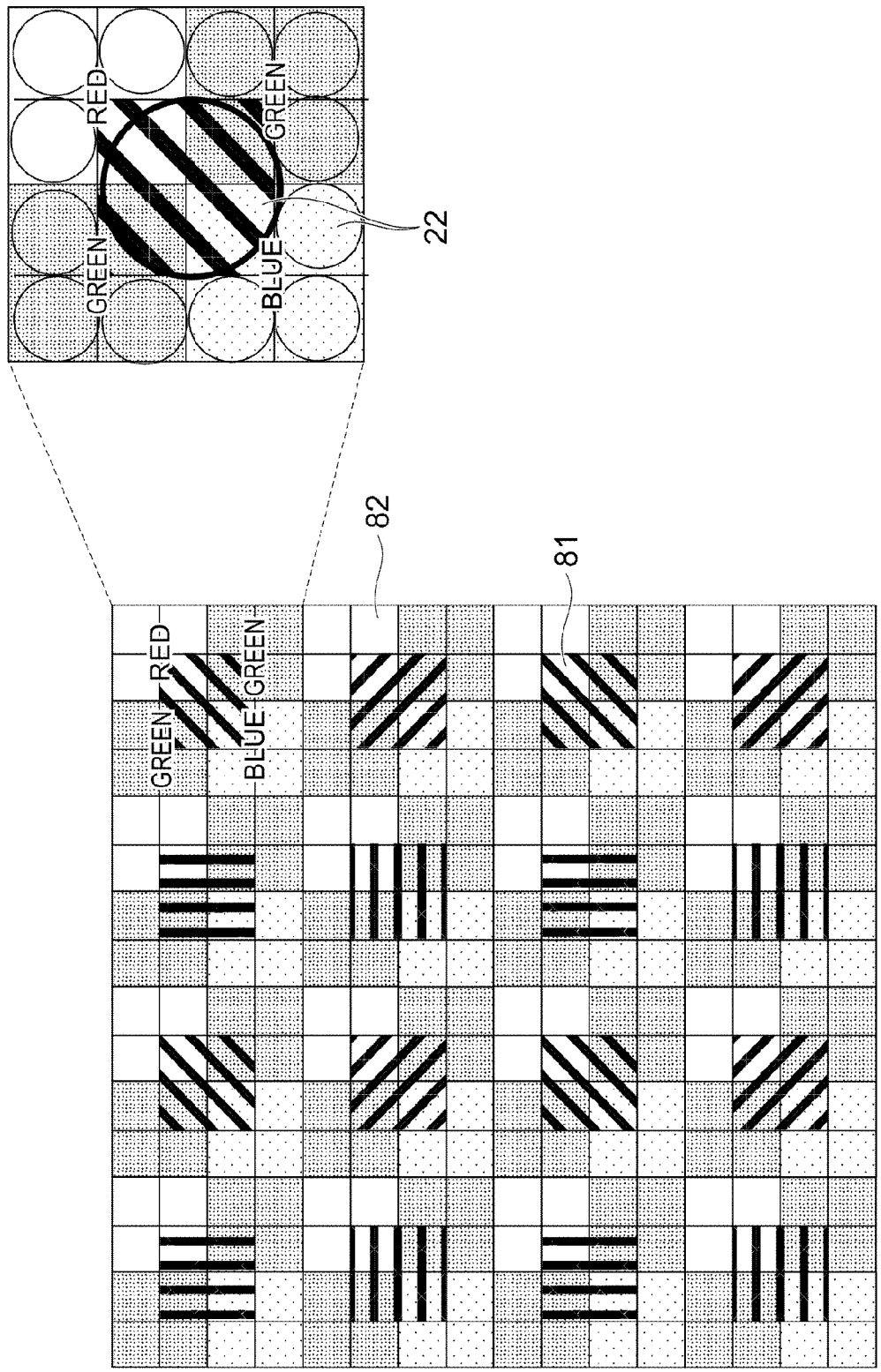
FIG. 13 is a plan view that illustrates a second variation example of the divided structure.

FIG. 13 is a plan view that illustrates a second variation example of the divided structure. In FIG. 13, one polarization pixel 81 is arranged in such a manner that the polarization pixel 81 spreads over four pixels closely arranged. More specifically, a photoelectric-conversion unit 8*a* includes a plurality of divided photoelectric-conversion units. Light polarized by a polarization element 8*b* is made to enter divided photoelectric-conversion units that are parts of two or more photoelectric-conversion units 8*a*. A size of the polarization pixel 81 is two times as large as lateral and vertical sizes of a pixel. An area of the polarization pixel 81 is four times as large as a pixel. In the example in FIG. 13, three of four divided pixels that constitute one pixel are assigned to non-polarization pixels 82, and are used for usual photoelectric conversion. The remaining one is assigned to a polarization pixel 81, and is used to obtain polarization information. Therefore, each pixel includes divided pixels used as non-polarization pixels 82, as similarly as FIG. 12. Therefore, defect correction does not need to be performed.

As illustrated on the right side in FIG. 13, three divided pixels used as non-polarization pixels 82 of four divided pixels into which one pixel is divided are separately provided with an on-chip lens 22. The remaining one divided pixel and other three adjoining divided pixels are provided with one large on-chip lens 22, and are used as polarization pixels 81. As described above, an area of four divided pixels adjoiningly arranged are used to make large polarization elements 8*b*. An on-chip lens 22 that corresponds to a size of the large polarization elements 8*b* is provided. The polarization elements 8*b* are easily made, and reliable polarization information can be obtained.

Figure 14:
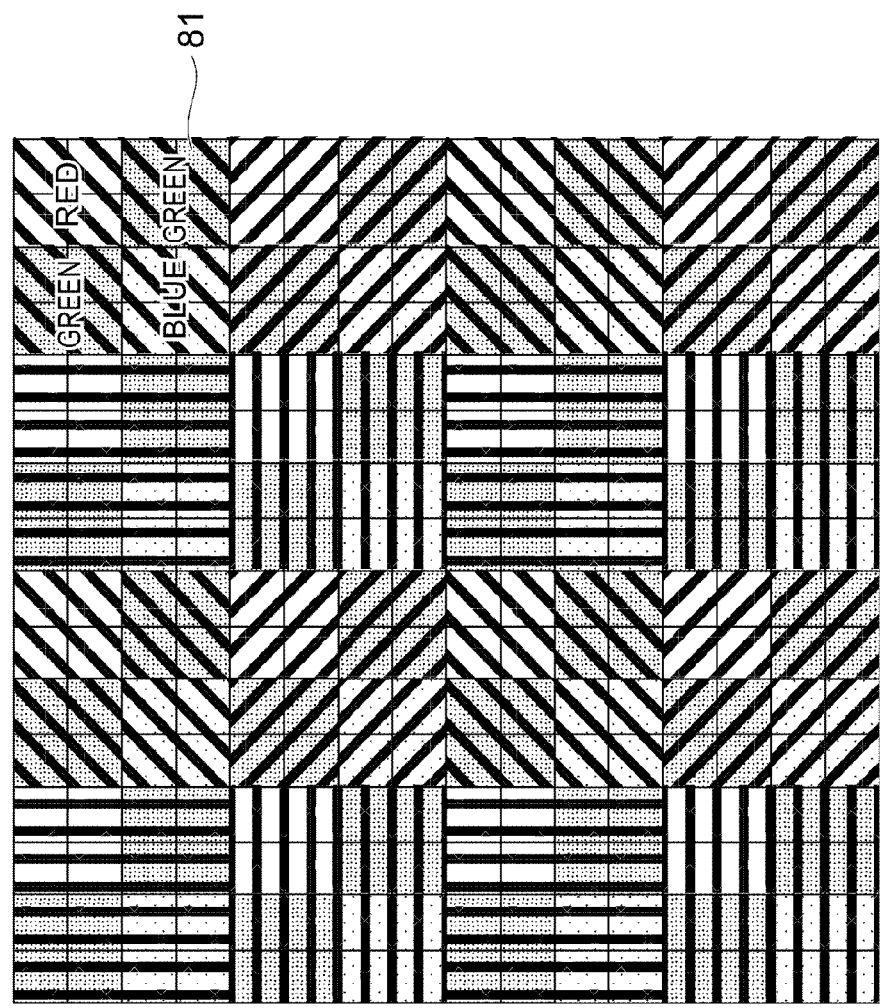
FIG. 14 is a plan view that illustrates a third variation example of the divided structure.

FIG. 14 is a plan view that illustrates a third variation example of the divided structure. In FIG. 14, polarization pixels 81 are arranged over a whole pixel area. More specifically, a plurality of photoelectric-conversion units 8*a* includes a plurality of divided photoelectric-conversion units. Light polarized by a plurality of polarization elements 8*b* is made to enter the plurality of photoelectric-conversion units 8*a*. That is to say, in an example in FIG. 14, only the polarization pixels 81 exist, and non-polarization pixels 82 do not exist. In the example in FIG. 14, each pixel is divided into four divided pixels. However, every divided pixel is used as the polarization pixels 81.

In a case in FIG. 14, the polarization pixels 81 are assigned to every divided pixel of every pixel. Therefore, output values from the photoelectric-conversion units 8*a* are uniformly small. Therefore, gain control processing that increases all output values from the photoelectric-conversion units 8*a* may be performed. There is a possibility that performing the gain control processing decreases an S/N ratio. However, processing, such as processing that increases a degree of noise reduction processing or edge emphasis processing, is performed to generate reliable digital pixel data.

Furthermore, the polarization elements 8*b* that correspond to a whole area of the photoelectric-conversion units 8*a* are provided as illustrated in FIG. 14. Consequently, polarization information for which an effect of a flare or diffracted light that has been made to enter any position of the photoelectric-conversion units 8*a* is considered is obtained. Therefore, accuracy of a correction amount extracted by a flare extraction unit 35 is increased.

Figure 15:
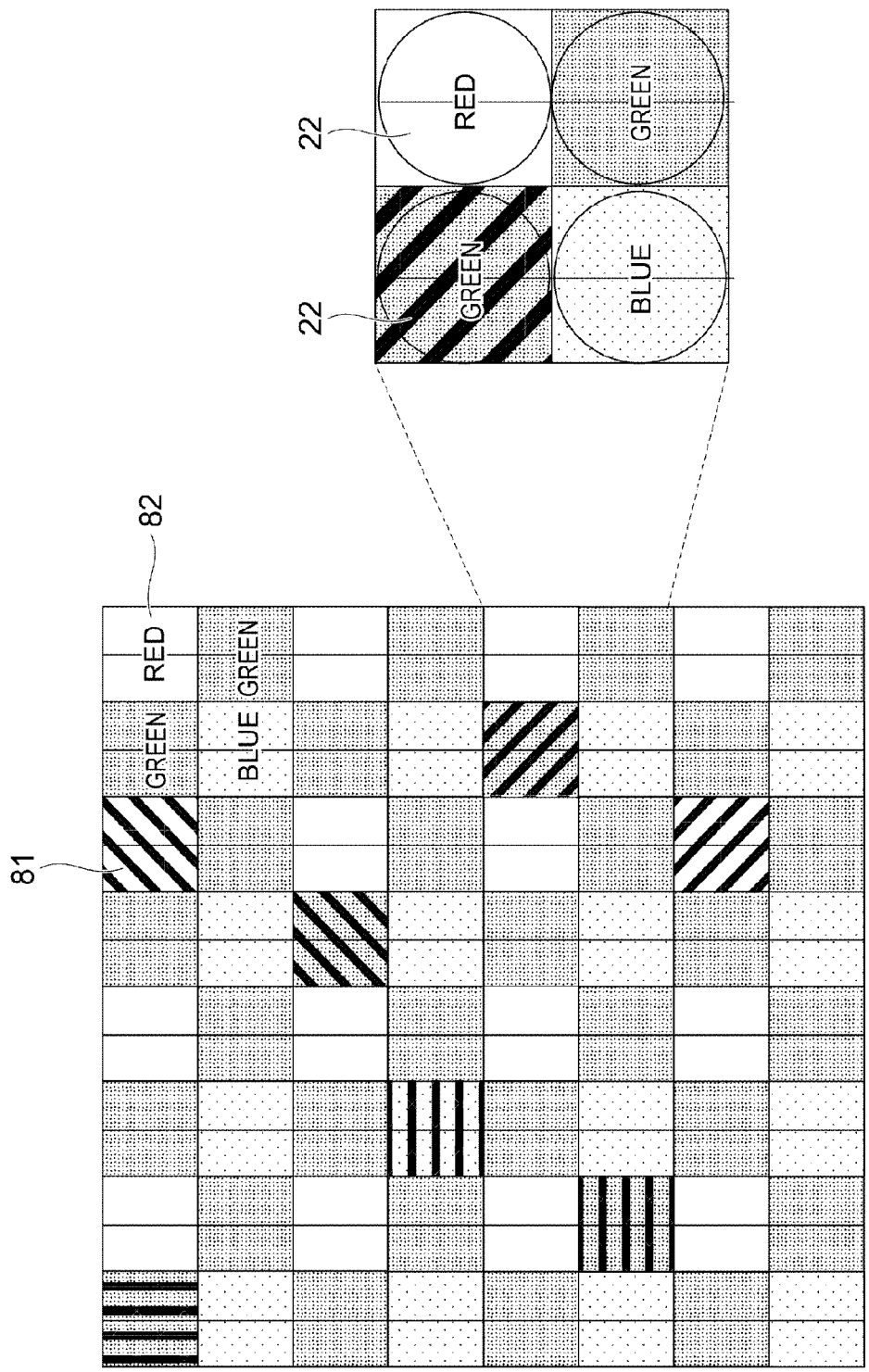
FIG. 15 is a plan view that illustrates a fourth variation example of the divided structure.

FIG. 15 is a plan view that illustrates a fourth variation example of the divided structure. A polarization pixel 81 being arranged between non-polarization pixels 82 is common to an example in FIG. 15 and FIG. 3 and the like. However, a non-polarization pixel 82 is divided into two right and left divided pixels in the example in FIG. 15. The example in FIG. 15 is different from other divided structures described above in this respect. More specifically, a photoelectric-conversion unit 8*a* includes a plurality of divided photoelectric-conversion units that are divided in one direction into a plural number and can detect phase difference information. Light polarized by polarization elements 8*b* is made to enter a plurality of divided photoelectric-conversion units of some photoelectric-conversion units 8*a*. Each divided pixel has a vertically elongated rectangular shape, for example. Two divided pixels are used to detect phase difference information. On the basis of the phase difference information, focus adjustment, for example, is performed.

A ratio of the plurality of non-polarization pixels 82 in FIG. 15 to each of the polarization pixels 81 is a plural number (for example, five non-polarization pixels 82) to one. Each of the polarization pixels 81 has a size of two divided pixels. As described above, the polarization elements 8*b* have line-and-space portions. Therefore, fine processing is not easy. However, the polarization elements 8*b* in FIG. 15 have a size twice as large as a size of a divided pixel. Therefore, the manufacture is relatively easy, and manufacture defects are less likely to occur. However, with respect to a pixel area where the polarization elements 8*b* are arranged, output values from photoelectric-conversion units 8*a* decrease. Therefore, pixels values of photoelectric-conversion units 8*a* that correspond to surrounding non-polarization pixels 82 are used to perform defect correction processing.

FIGS. 11 to 15 described above illustrate typical examples of the divided structure. Divided structures except the illustrated divided structures are possible. The present exemplary embodiment can be applied to all divided structures. Photoelectric-conversion units 8*a* may be divided into any shape and size. Therefore, divided shapes, divided sizes, and divided numbers of non-polarization pixels 82 are optional. Furthermore, polarization pixels 81 may be divided or may not be divided.

As described above, in the third exemplary embodiment, at least non-polarization pixels 82 have a divided structure. Therefore, if part of divided pixels in each pixel is/are assigned to a polarization pixel(s) 81 to obtain polarization information, and remaining divided pixel(s) is/are assigned to the non-polarization pixels 82 to obtain color information, defect correction does not need to be performed for each pixel.

Furthermore, each pixel has a divided structure, and phase difference information can be detected in addition to polarization information. Moreover, if the non-polarization pixels 82 have a divided structure, and the polarization pixels 81 do not have a divided structure, a size of the polarization pixels 81 can be made larger than the non-polarization pixels 82. Therefore, the polarization elements 8b are easily made.

Fourth Exemplary Embodiment

A fourth exemplary embodiment is characterized by a structure of a displaying unit 2 in an electronic device 1 in which a camera module 3 is arranged on a side opposite a displaying surface of the displaying unit 2.

As described above, a circular-polarization sheet 5 is provided in the displaying unit 2 to increase easiness of seeing. However, the circular-polarization sheet 5 shields at least part of light. Therefore, if subject light that has passed the displaying unit 2 is captured with the camera module 3, malfunctions, such as a captured image becoming dark, occur. Similarly, a touch sensor, a displaying panel 4, such as an OLED unit, and the like in the displaying unit 2 do not have very high transmittance. Therefore, the present exemplary embodiment is characterized by through holes provided in an area in the displaying unit 2, and the area is on top of the camera module 3 in a front-back direction.

Figure 16:
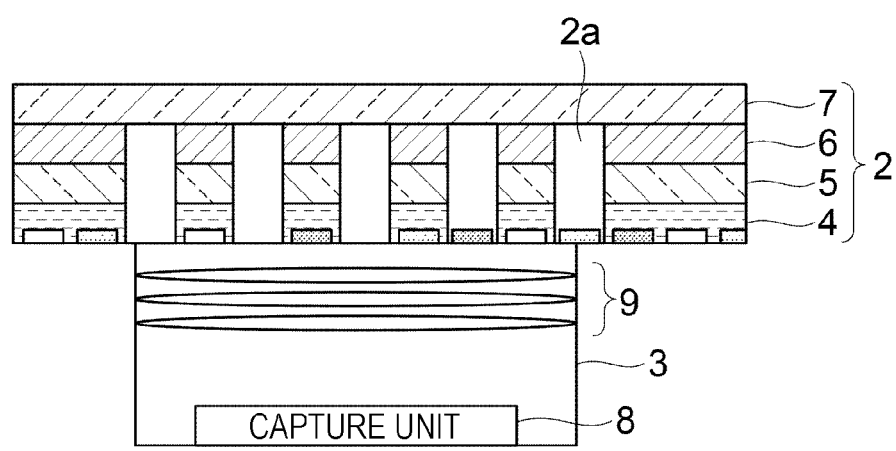
FIG. 16 is a schematic cross-sectional view of an electronic device according to a fourth exemplary embodiment.

FIG. 16 is a schematic cross-sectional view of the electronic device 1 according to the fourth exemplary embodiment. The displaying unit 2 in the electronic device 1 in FIG. 16 has a plurality of through holes 2a in a portion that is on top of the camera module 3 in the front-back direction. These through holes 2a are provided through a plurality of layers that have a low transmittance, such as the touch sensor, the circular-polarization sheet 5, the displaying panel 4, and the like, in the displaying unit 2. A diameter size of the through holes 2a differs for each of the layers. For example, the circular-polarization sheet 5 has the through holes 2a that have a diameter size that is the same as a diameter size of a capture unit 8 of the camera module 3. On the other hand, the touch sensor and the displaying panel 4 may be provided with the plurality of through holes 2a that are small and within a diameter size of the capture unit 8 not to adversely affect display or touch sensitivity of the displaying unit 2.

There is a possibility that providing these through holes 2a slightly affects easiness of seeing or touch sensitivity of a displaying screen 1a of the displaying unit 2. However, a diameter size of the camera module 3 is only approximately several millimeters. Therefore, there is practically almost no problem. Providing these through holes 2a increases transmittance of subject light that passes the displaying unit 2, and increases an image quality of a captured image captured with the camera module 3.

Figure 17:
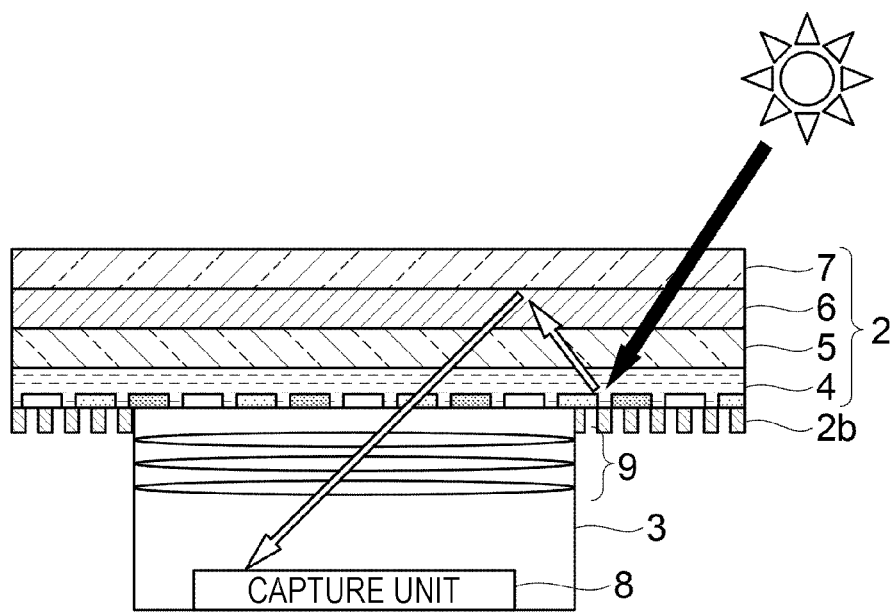
FIG. 17 is a cross-sectional view of a first variation example where a structure of a displaying unit 2 is characterized.

An example where a structure of the displaying unit 2 is characterized is not only FIG. 16. Various examples are conceivable. FIG. 17 is a cross-sectional view of a first variation example where a structure of a displaying unit 2 is characterized. In the displaying unit 2 in FIG. 17, polarization members 2b that polarize light into a particular direction are arranged on a back surface of a displaying panel 4. In an example in FIG. 17, the polarization members 2b are arranged on a back surface side of the displaying panel 4 in an area that vertically is not on top of a camera module 3.

If light that has been made to enter the displaying unit 2 is made to enter the polarization members 2b, the light is polarized into a particular direction when the light is reflected. The reflected light is further reflected by, for example, another layer of the displaying unit 2, and is made to enter a capture unit 8. The reflected light is polarized into a particular direction when the reflected light is made to enter the capture unit 8. Therefore, if at least part of a plurality of polarization elements 8b has a polarization characteristic that is the same as a polarization characteristic of the polarization members 2b, polarization information of light polarized by the polarization members 2b is surely obtained.

As described above, the polarization members 2b that are polarized into a particular direction are provided in the displaying unit 2. Consequently, light made to enter the capture unit 8 is polarized into the particular direction. A plurality of polarization pixels 81 more surely extracts a flare component or a diffraction component.

Figure 18:
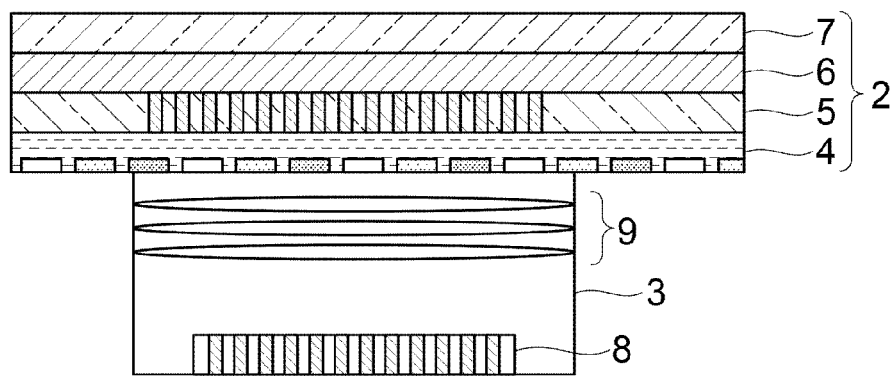
FIG. 18 is a cross-sectional view of a second variation example where a structure of a displaying unit 2 is characterized.

FIG. 18 is a cross-sectional view of a second variation example where a structure of a displaying unit 2 is characterized. The displaying unit 2 in FIG. 18 is provided with polarization members 2b polarized in a particular direction. The polarization members 2b are in an area in a circular-polarization sheet 5, and the area is on top of a camera module 3 in a front-back direction. It is originally intended that the camera module 3 captures light made to enter substantially in parallel to a light axis. Therefore, the polarization members 2b that polarize light into a direction that is substantially in parallel to a light axis are provided in, for example, an area of the circular-polarization sheet 5, and the area is on top of the camera module 3 in a front-back direction. Therefore, light that passes the area is polarized into a direction that is substantially in parallel to a light axis, and is made to enter a capture unit 8. If a plurality of polarization elements 8b in the capture unit 8 has a polarization characteristic that is the same as a polarization characteristic of the polarization members 2b, light that has been made to enter the capture unit 8 is surely received by a plurality of polarization pixels 81.

As described above, in the fourth exemplary embodiment, part of the displaying unit 2 is processed to increase transmittance when light passes the displaying unit 2, and to increase an image quality of a captured image captured with the camera module 3. As a more specific example, an opening is provided in an area that is on top of the camera module 3 in a front-back direction to increase transmittance when light passes the displaying unit 2, and to increase an image quality of a captured image captured with the camera module 3.

Furthermore, the polarization members 2b that are polarized into a particular direction are provided for at least part of the displaying unit 2. Consequently, light that is repeatedly reflected in the displaying unit 2 and is made to enter the capture unit 8 is polarized into a particular direction, and the light is surely received with the polarization pixels 81.

Fifth Exemplary Embodiment

Figure 19:
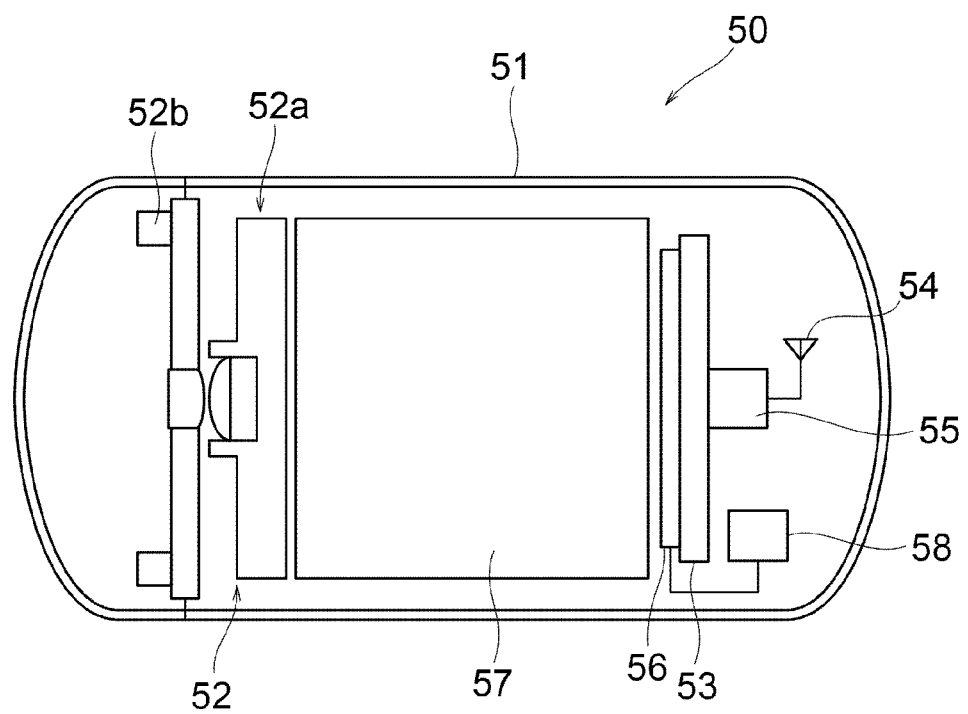
FIG. 19 is a plan view of a case where an electronic device according to the first to fourth exemplary embodiments is applied to a capsule endoscope.

As concrete prospective electronic devices 1 that include configurations described in the first to fourth exemplary embodiments described above, various things are conceivable. For example, FIG. 19 is a plan view of a case where an electronic device 1 according to the first to fourth exemplary embodiments is applied to a capsule endoscope 50. The capsule endoscope 50 in FIG. 19 includes a camera (very small camera) 52 that images an inside of a body cavity, memory 53 that records image data imaged with the camera 52, and a wireless transmitter 55 that transmits the recorded image data to an outside through an antenna 54 after the capsule endoscope 50 is discharged from a body of a subject, in a housing 51. The housing 51 has, for example, both end surfaces that are hemispherical, and a cylindrical center.

Furthermore, a central processing unit (CPU) 56 and a coil (magnetic force to electric current conversion coil) 57 are provided in the housing 51. The CPU 56 controls imaging with the camera 52, data storage operation into the memory 53, and data transmission by the wireless transmitter 55 from the memory 53 to a data receiving device (not illustrated) outside the housing 51. The coil 57 supplies electrical energy to the camera 52, the memory 53, the wireless transmitter 55, the antenna 54, and light sources 52b as described later.

Moreover, the housing 51 is provided with a magnetic (lead) switch 58 that detects the capsule endoscope 50 being loaded into a data receiving device. The CPU 56 supplies electrical energy from the coil 57 to the wireless transmitter 55 when the lead switch 58 detects the being loaded into the data receiving device, and data can be transmitted.

The camera 52 includes a capture element 52a that includes, for example, an objective optical system 9 that images an inside of a body cavity, and the plurality of light sources 52b that illuminates an inside of a body cavity. Specifically, the camera 52 includes a complementary metal oxide semiconductor sensor (CMOS), a charge coupled device (CCD), or the like provided with light emitting diodes (LEDs), for example, as the light sources 52b.

Figure 20:
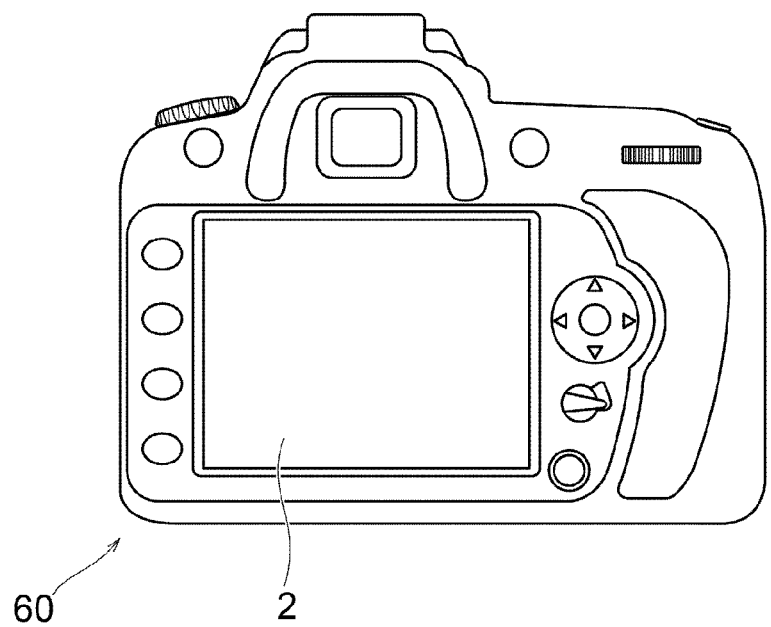
FIG. 20 is a back view of a case where an electronic device according to the first to fourth exemplary embodiments is applied to a digital single-lens reflex camera.

A concept is that a displaying unit 2 in the electronic device 1 according to the first to fourth exemplary embodiments includes a light emitting body, such as the light sources 52b in FIG. 19. The capsule endoscope 50 in FIG. 19 includes, for example, the two light sources 52b. These light sources 52b may be configured by a displaying panel 4 that includes a plurality of light source units, or an LED module that includes a plurality of LEDs. In this case, arranging a capture unit 8 of the camera 52 under the displaying panel 4 or the LED module decreases restrictions on layout arrangement of the camera 52, and a size of the capsule endoscope 50 is decreased Furthermore, FIG. 20 is a back view of a case where an electronic device 1 according to the first to fourth exemplary embodiments is applied to a digital single-lens reflex camera 60. The digital single-lens reflex camera 60 or a compact camera includes a displaying unit 2 on a back surface on a side opposite a lens. The displaying unit 2 displays a preview display. A camera module 3 may be arranged on a side opposite a displaying surface of the displaying unit 2, and a face image of a person who performs imaging may be displayed on a displaying screen 1a of the displaying unit 2. In the electronic device 1 according to the first to fourth exemplary embodiments, the camera module 3 is arranged in an area that is on top of the displaying unit 2. Therefore, the camera module 3 does not need to be provided in a bezel area of the displaying unit 2. A size of the displaying unit 2 is increased as large as possible.

Figure 21A:
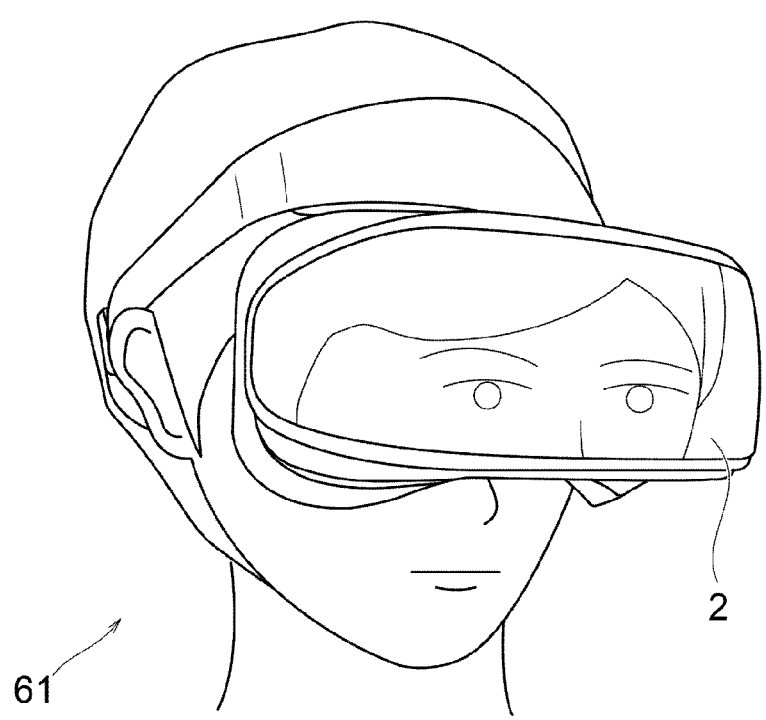
FIG. 21A is a view that illustrates an example where an electronic device 1 is applied to a head-mounted display (HMD).
Figure 21B:
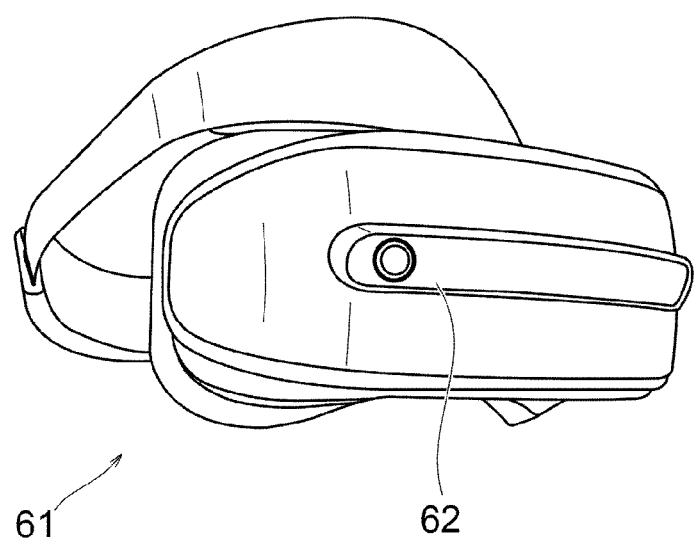
FIG. 21B is a view that illustrates a current HMD.

FIG. 21A is a plan view that illustrates an example where an electronic device 1 according to the first to fourth exemplary embodiments is applied to a head-mounted display (hereinafter referred to as HMD) 61. The HMD 61 in FIG. 21A is used for virtual reality (VR), augmented reality (AR), mixed reality (MR), substituional reality (SR), or the like. A current HMD is equipped with a camera 62 on an external surface, as illustrated in FIG. 21B. A person who wears an HMD can see a surrounding image. On the other hand, there is a problem that surrounding people cannot see eyes and an expression of the person who wears the HMD.

Therefore, in FIG. 21A, a displaying surface of a displaying unit 2 is provided on an external surface of the HMD 61, and a camera module 3 is provided on a side opposite the displaying surface of the displaying unit 2. Therefore, an expression of a wearer imaged with the camera module 3 can be displayed on the displaying surface of the displaying unit 2. People around the wearer can grasp an expression and eye movement of the wearer in real time.

In a case in FIG. 21A, the camera module 3 is provided on a back surface side of the displaying unit 2. Therefore, restrictions on a position where the camera module 3 is attached are eliminated, and a design freedom of the HMD 61 is increased. Furthermore, the camera is arranged at an optimum position. Therefore, defects, such as a line-of-sight of a wearer displayed on the displaying surface not meeting, are not allowed.

As described above, according to the fifth exemplary embodiment, an electronic device 1 according to the first to fourth exemplary embodiments can be used for various applications, and a utility value is increased.

Sixth Exemplary Embodiment

Depending on types of light sources of light made to enter an electronic device 1, or display luminance of a displaying unit 2, easiness of occurrence of a flare or diffraction may vary. Therefore, the type of a light source may be estimated when a correction amount of a flare component or a diffracted-light component is calculated.

Figure 22:
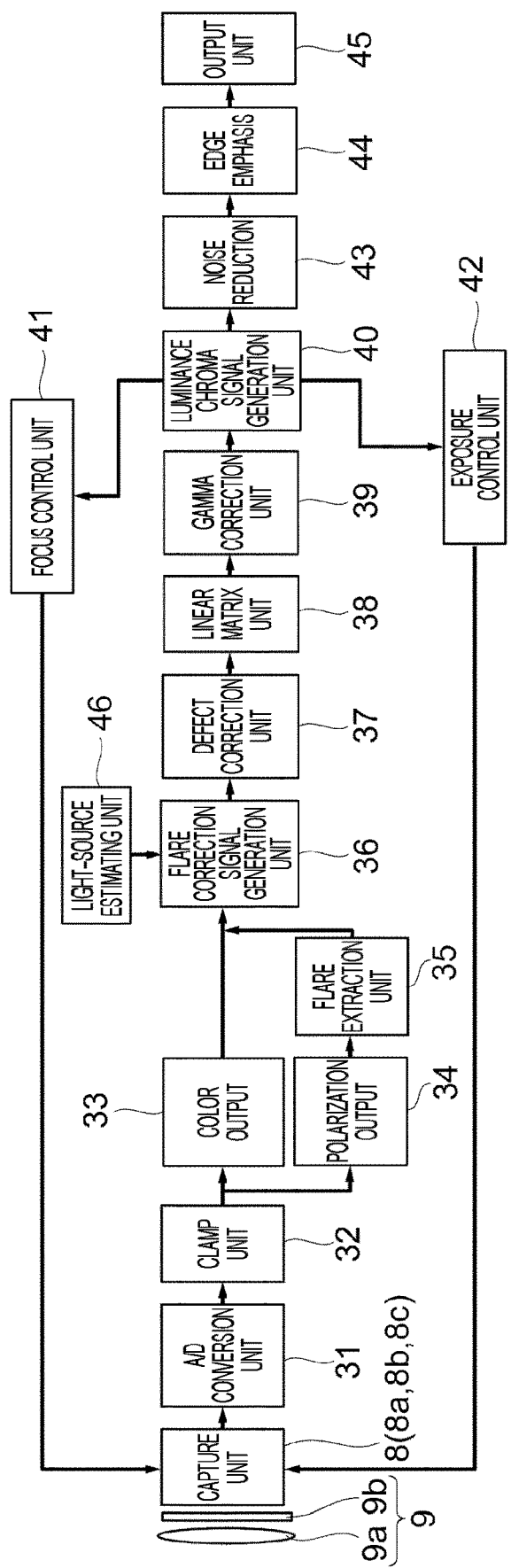
FIG. 22 is a block diagram that illustrates a schematic configuration of an electronic device according to a sixth exemplary embodiment.

FIG. 22 is a block diagram that illustrates a schematic configuration of an electronic device 1 according to a sixth exemplary embodiment. The electronic device 1 in FIG. 22 includes a light-source estimating unit 46, in addition to a configuration in FIG. 8. The light-source estimating unit 46 estimates a light source of light made to enter a displaying unit 2. The light-source estimating unit 46 may estimate a light source from a sensitivity difference in each color of RGB that has been converted from light into electricity by photoelectric-conversion units 8a, or may use an illumination sensor, a multispectral sensor, or the like to estimate a light source. Furthermore, it may be determined with a global positioning system (GPS) sensor with which the electronic device 1 is equipped whether the electronic device 1 exists inside or outside a building, and a light source may be estimated to be sunlight or illumination light. Furthermore, a gyro sensor with which the electronic device 1 is equipped may determine an inclination angle of the electronic device 1, and a light source may be estimated on the basis of the inclination angle.

On the basis of a light source estimated by the light-source estimating unit 46, a flare correction signal generation unit 36 controls a correction amount of a captured image that has been converted from light into electricity by a plurality of non-polarization pixels 82. More specifically, a formula for calculating a correction amount may be changed for every type of light source. Furthermore, a correction amount may be controlled for every type of light source, and every color of RGB.

Figure 23:
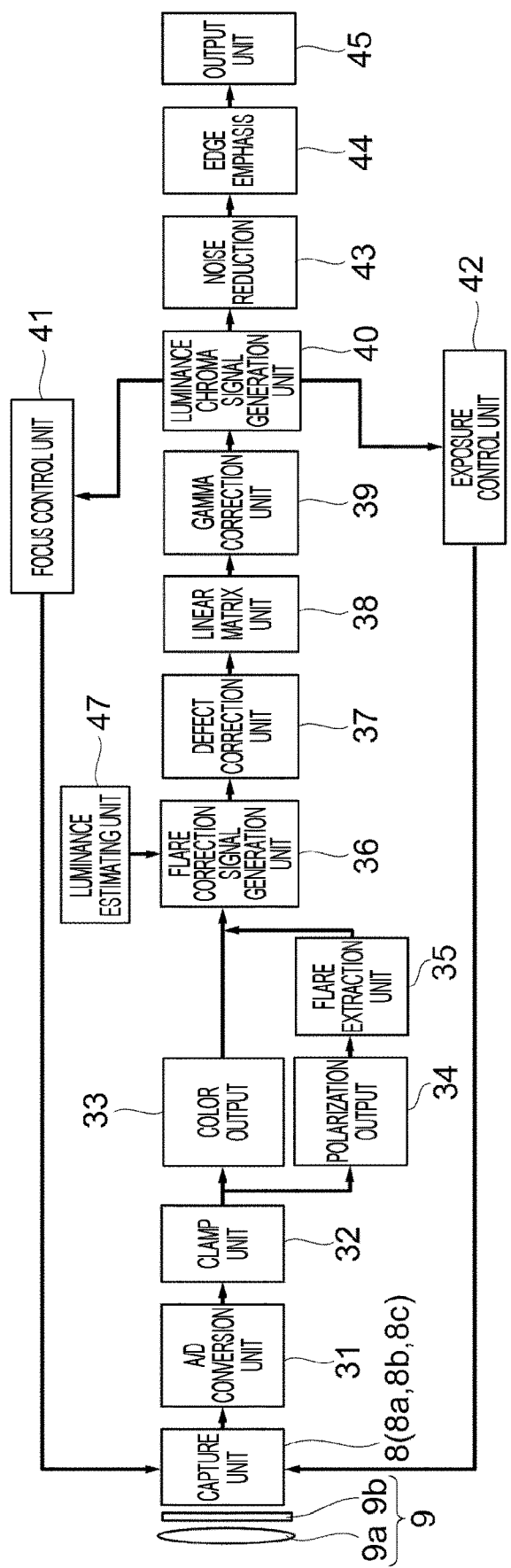
FIG. 23 is a block diagram that illustrates a schematic configuration of an electronic device according to a variation example of the sixth exemplary embodiment.

FIG. 23 is a block diagram that illustrates a schematic configuration of an electronic device 1 according to a variation example of the sixth exemplary embodiment. The electronic device 1 in FIG. 23 includes a luminance estimating unit 47, in addition to a configuration in FIG. 8. The luminance estimating unit 47 estimates display luminance in a displaying unit 2. Using, for example, a signal from a display control unit that performs display control of the displaying unit 2 and is not illustrated, the luminance estimating unit 47 estimates display luminance in the displaying unit 2.

On the basis of display luminance of the displaying unit 2 estimated by the luminance estimating unit 47, a flare correction signal generation unit 36 controls a correction amount of a captured image that has been converted from light into electricity by a plurality of non-polarization pixels 82. More specifically, on the basis of luminance of every color of RGB displayed on the displaying unit 2, a correction amount may be separately controlled for each color.

Furthermore, an electronic device 1 that includes both a light-source estimating unit 46 in FIG. 22 and a luminance estimating unit 47 in FIG. 23 is conceivable. In this case, a flare correction signal generation unit 36 controls a correction amount on the basis of the type of a light source and display luminance of a displaying unit 2.

As described above, in the sixth exemplary embodiment, the type of a light source made to enter an electronic device 1 or display luminance of a displaying unit 2 is considered, and a correction amount for correcting an effect of a flare component or a diffracted-light component is controlled. Therefore, the flare component or the diffracted-light component is more appropriately removed from a captured image.

Seventh Exemplary Embodiment

An optical system 9 of a camera module 3 of an electronic device 1 according to a seventh exemplary embodiment is different from an optical system 9 of a camera module 3 according to the first to sixth exemplary embodiment.

Figure 24:
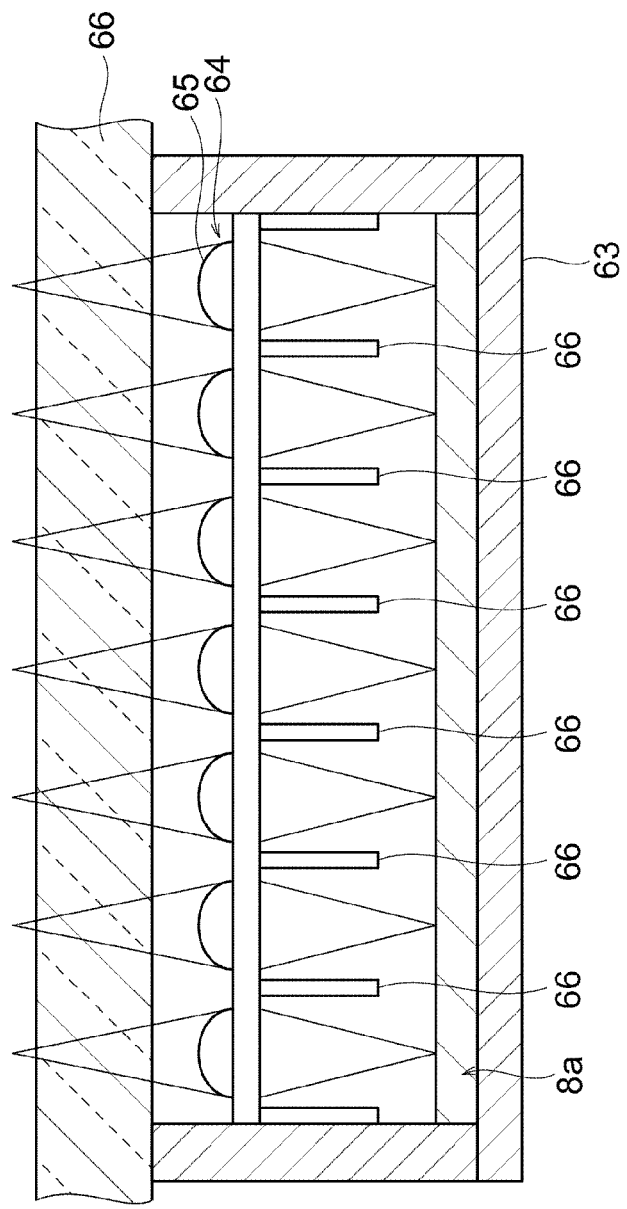
FIG. 24 is a view that illustrates a cross-sectional structure of a capture unit of a camera module with which an electronic device according to a seventh exemplary embodiment is equipped.

FIG. 24 is a view that illustrates a cross-sectional structure of a capture unit 8 of the camera module 3 with which the electronic device 1 according to the seventh exemplary embodiment is equipped. The capture unit 8 in FIG. 24 includes a microlens array 64 instead of a single lens or a group of single lenses that are aligned in an optical-axis direction.

More specifically, the capture unit 8 in FIG. 24 includes a photoelectric-conversion units 8a arranged along a bottom surface of a housing 63, the microlens array 64 arranged over the photoelectric-conversion units 8a, a plurality of light shielding bodies 66 arranged between adjacent microlenses 65, and a light guiding sheet 67 arranged over the microlens array 64.

As described above, the microlens array 64 is provided as the optical system 9 of the capture unit 8. Consequently, an effect of an adjacent pixel is not allowed, and colors are less likely to blur.

Eighth Exemplary Embodiment

The first to seventh exemplary embodiments described above illustrate examples in which a flare or diffracted light is removed. However, an electronic device 1 according to the present disclosure does not only remove a flare or diffracted light, but also can be applied to, for example, a purpose of removing shine of a subject. In an electronic device 1 according to the present exemplary embodiment, a camera module 3 is arranged on a side opposite a displaying surface of a displaying unit 2. Therefore, in a case where a wide-angle or fisheye lens is attached to the camera module 3, the camera module 3 can capture the whole displaying surface of the displaying unit 2. Therefore, a wet finger that is often wrongly recognized with an existing touch panel 6 is detected. In addition, shine of a wet finger is removed, and unevenness of a finger print is detected. Consequently, touch operation and fingerprint authentication become possible.

More specifically, a plurality of polarization pixels 81 that includes a plurality of polarization elements 8b may obtain polarization information caused by a shine component contained in a subject light. In this case, on the basis of the polarization information, a flare extraction unit 35 in FIG. 8 extracts a correction amount based on a shine component. Then, a flare correction signal generation unit 36 generates an image from which the shine component has been removed from a subject image.

Furthermore, a fact that a camera module 3 is arranged on a side opposite a displaying surface of a displaying unit 2 is a condition for each of the exemplary embodiments described above. However, in a case where a reflection sheet exists in a lowest layer of a displaying panel 4, such as an OLED unit, part of the reflection sheet may be bored, and a camera module 3 may be arranged in the bored part, or a camera module 3 may be arranged in such a manner that the camera module 3 is in part of a displaying panel 4.

Note that the present technology may be configured as follows:

(1) An electronic device including:
a displaying unit; and a capture unit arranged on a side opposite a displaying surface of the displaying unit,
in which the capture unit includes:
a plurality of photoelectric-conversion units that converts light that has been made to enter through the displaying unit into electricity; and
a plurality of polarization elements arranged on a light entering side of at least one photoelectric-conversion unit of the plurality of photoelectric-conversion units.

(2) The electronic device according to (1), further including a correction unit that corrects a captured image that has been converted from light into electricity, on the basis of polarization information that has been polarized by the plurality of polarization elements and has been converted from light into electricity by the photoelectric-conversion unit.

(3) The electronic device according to (2), in which the correction unit removes a component that includes at least one of reflected light or diffracted light that has occurred when the reflected light or the diffracted light passes the displaying unit, has been made to enter the plurality of photoelectric-conversion units, and has been captured.

(4) The electronic device according to (2) or (3), in which the correction unit performs subtraction processing of a correction amount based on polarization information data that includes the polarization information that has been digitalized, to digital pixel data that has been converted from light into electricity by the photoelectric-conversion units and has been digitalized, to correct the digital pixel data.

(5) The electronic device according to any one of (2) to (4), further including a polarization member that is provided for the displaying unit and polarizes light that has been made to enter, into a particular direction, in which at least one of the plurality of polarization elements makes light polarized by the polarization member pass, and
the correction unit corrects a captured image that has been converted from light into electricity by the plurality of photoelectric-conversion units, on the basis of the polarization information that has been polarized by the polarization member, has passed the polarization element, and has been converted from light into electricity by the photoelectric-conversion unit.

(6) The electronic device according to any one of (2) to (4), further including a light-source estimating unit that estimates a type of a light source of light made to enter the displaying unit, in which the correction unit controls a correction amount of a captured image that has been converted from light into electricity by the plurality of photoelectric-conversion units, on the basis of a type of a light source estimated by the light-source estimating unit.

(7) The electronic device according to any one of (2) to (4), further including a luminance estimating unit that estimates display luminance of the displaying unit, in which the correction unit controls a correction amount of a captured image that has been converted from light into electricity by the plurality of photoelectric-conversion units, according to display luminance of the displaying unit.

(8) The electronic device according to any one of (2) to (7), further including a signal processing unit that performs at least one of exposure processing, focus adjustment processing, or white balance control processing, to a captured image corrected by the correction unit.

(9) The electronic device according to any one of (2) to (7), further including:

a signal processing unit that performs at least one type of signal processing to a captured image corrected by the correction unit; and a parameter control unit that controls a parameter when the signal processing is performed to the captured image, according to a correction amount with which the correction unit corrects the captured image.

(10) The electronic device according to (9), in which the signal processing performed by the signal processing unit includes at least one of noise reduction processing that removes a noise component contained in the captured image, or edge emphasis processing that emphasizes an edge of the captured image, and the parameter control unit controls a parameter when at least one of the noise reduction processing or the edge emphasis processing is performed, according to the correction amount.

(11) The electronic device according to (10), in which as the correction amount of a captured image increases, the parameter control unit performs at least one of processing that increases a degree of noise reduction in the noise reduction processing, or a processing that increases a degree of edge emphasis in the edge emphasis processing.

(12) The electronic device according to any one of (9) to (11), in which the signal processing unit performs the signal processing that includes exposure control processing, and performs exposure control in such a manner that output values from the plurality of photoelectric-conversion units are not saturated, when the signal processing unit performs the exposure control processing.

(13) The electronic device according to any one of (1) to (12), further including a defect correction unit that, to correct an output value from the photoelectric-conversion unit where light polarized by the polarization elements is made to enter, uses output values from surrounding two or more of the photoelectric-conversion units.

(14) The electronic device according to any one of (1) to (13), further including a capture device that includes the photoelectric-conversion units and an optical system that focuses light on the photoelectric-conversion units, in which the capture device is arranged on a side opposite the displaying surface of the displaying unit at substantially a center of the displaying surface.

(15) The electronic device according to any one of (1) to (14), further including a defect correction unit that corrects a saturated output value from a photoelectric-conversion unit of the plurality of photoelectric-conversion units, on the basis of polarization information that has been polarized by at least one of the polarization elements arranged around the photoelectric-conversion unit and has been converted from light into electricity by the photoelectric-conversion unit.

(16) The electronic device according to any one of (1) to (15), in which the photoelectric-conversion units include a plurality of divided photoelectric-conversion units, and light polarized by the plurality of polarization elements is made to enter the plurality of divided photoelectric-conversion units of part of the photoelectric-conversion units.

(17) The electronic device according to any one of (1) to (15), in which the photoelectric-conversion units include a plurality of divided photoelectric-conversion units, and light polarized by the polarization elements is made to enter part of the divided photoelectric-conversion units of some of the photoelectric-conversion units.

(18) The electronic device according to any one of (1) to (15), in which the photoelectric-conversion units include a plurality of divided photoelectric-conversion units, and light polarized by the polarization elements is made to enter the divided photoelectric-conversion units of parts of two or more of the photoelectric-conversion units.

(19) The electronic device according to any one of (1) to (15), in which the plurality of photoelectric-conversion units includes a plurality of divided photoelectric-conversion units, and light polarized by the plurality of polarization elements is made to enter the plurality of photoelectric-conversion units.

(20) The electronic device according to any one of (1) to (15), in which the photoelectric-conversion units include a plurality of divided photoelectric-conversion units that is divided in one direction and detects phase difference information, and light polarized by the polarization elements is made to enter the plurality of divided photoelectric-conversion units of some of the photoelectric-conversion units.

Aspects of the present disclosure are not limited to each of the exemplary embodiments described above, but include various variations that a person skilled in the art can conceive. Effects of the present disclosure also are not limited to the contents described above. That is to say, various additions, changes, and partial omissions are possible without departing from a conceptional idea and a gist of the present disclosure derived from contents described in the claims and the equivalent.

REFERENCE SIGNS LIST

1 Electronic device
1a Displaying screen
1b Bezel
2 Displaying unit
3 Camera module
4 Displaying panel
5 Circular-polarization sheet 6 Touch panel
7 Cover glass
8 Capture unit
8a Photoelectric-conversion unit
8b Polarization element
8d Line portion
8f Light reflection layer
8g Insulation layer
8h Light absorption layer
9 Optical system
11 Board
11a First surface
11b Second surface
12 Wiring layer
13 Interlayer insulation film
14 Leveling layer
15 Light shielding layer
16 Base insulation layer
17 Insulation layer
31 A/D converter
32 Clamp unit
33 Color output unit
34 Polarization output unit
35 Flare extraction unit
36 Flare correction signal generation unit
37 Defect correction unit
38 Linear matrix unit
39 Gamma correction unit
40 Luminance chroma signal generation unit
41 Focus adjustment unit
42 Exposure control unit
43 Noise reduction unit
44 Edge emphasis unit
45 Output unit
81 Change element
82 Non-polarization pixel

The invention claimed is:

1. An electronic device comprising:
a display; and
a capture unit arranged on a side opposite a displaying surface of the display,
wherein the capture unit includes:
a plurality of photoelectric-conversion units that converts light that has been made to enter through the display into electricity;
a plurality of polarization elements arranged on a light entering side of at least one photoelectric-conversion unit of the plurality of photoelectric-conversion units; and
a controller configured to
correct a captured image that has been converted from light into electricity by the plurality of photoelectric-conversion units, on a basis of polarization information that has been polarized by the plurality of polarization elements and has been converted from light into electricity, and
estimate display luminance of the display, wherein
correcting the captured image includes controlling a correction amount of the captured image that has been converted from light into electricity by the plurality of photoelectric-conversion units, according to the estimated display luminance of the display.

2. The electronic device according to claim 1, wherein correcting the captured image includes removing a component that includes at least one of reflected light or diffracted light that has occurred when the reflected light or the diffracted light passes the display, has been made to enter the plurality of photoelectric-conversion units, and has been captured.

3. The electronic device according to claim 1, wherein correcting the captured image includes performing subtraction processing of the correction amount based on polarization information data that includes the polarization information that has been digitalized, to digital pixel data that has been converted from light into electricity by the photoelectric-conversion units and has been digitalized, to correct the digital pixel data.

4. The electronic device according to claim 1, further comprising a polarization member that is provided for the display and polarizes light that has been made to enter, into a particular direction,
wherein at least one of the plurality of polarization elements makes light polarized by the polarization member pass, and
correcting the captured image includes correcting the captured image that has been converted from light into electricity by the plurality of photoelectric-conversion units, on a basis of the polarization information that has been polarized by the polarization member, has passed the polarization element, and has been converted from light into electricity by the photoelectric-conversion unit.

5. The electronic device according to claim 1, wherein
the controller is configured to estimate a type of a light source of light made to enter the display, and
correcting the captured image includes controlling the correction amount of the captured image that has been converted from light into electricity by the plurality of photoelectric-conversion units, on a basis of the estimated type of a light source.

6. The electronic device according to claim 1, wherein
the controller is configured to perform at least one of exposure processing, focus adjustment processing, or white balance control processing, to the captured image.

7. The electronic device according to claim 1, wherein
the controller is configured to perform at least one type of signal processing to the captured image that is corrected, and
control a parameter when the signal processing is performed to the captured image, according to the correction amount applied to the captured image.

8. The electronic device according to claim 7,
wherein the signal processing includes at least one of noise reduction processing that removes a noise component contained in the captured image, or edge emphasis processing that emphasizes an edge of the captured image, and
controlling the parameter controls the parameter when at least one of the noise reduction processing or the edge emphasis processing is performed, according to the correction amount.

9. The electronic device according to claim 1, wherein the controller is configured to:
perform at least one type of signal processing to the captured image that is corrected, and
control a parameter when the signal processing is performed to the captured image, according to the correction amount applied to the captured image, wherein
the signal processing includes at least one of noise reduction processing that removes a noise component contained in the captured image, or edge emphasis processing that emphasizes an edge of the captured image, controlling the parameter controls the parameter when at least one of the noise reduction processing or the edge emphasis processing is performed, according to the correction amount, and as the correction amount of the captured image increases, controlling the parameter performs at least one of processing that increases a degree of noise reduction in the noise reduction processing, or a processing that increases a degree of edge emphasis in the edge emphasis processing.

10. The electronic device according to claim 7, wherein the controller is configured to perform the signal processing to include exposure control processing, and to perform the exposure control in such a manner that output values from the plurality of photoelectric-conversion units are not saturated, when the signal processor performs the exposure control processing.

11. The electronic device according to claim 1, wherein the controller is configured to perform defect correction to correct an output value from the photoelectric-conversion unit where light polarized by the polarization elements is made to enter, and to use output values from a surrounding two or more of the photoelectric-conversion units.

12. The electronic device according to claim 1, further comprising a capture device including an optical system that focuses light on the photoelectric-conversion units, wherein the capture device is arranged on the side opposite the displaying surface of the display at substantially a center of the displaying surface.

13. The electronic device according to claim 1, wherein the controller is configured to perform defect correction unit that corrects a saturated output value from a photoelectric-conversion unit of the plurality of photoelectric-conversion units, on a basis of polarization information that has been polarized by at least one of the polarization elements arranged around the photoelectric-conversion unit and has been converted from light into electricity by the photoelectric-conversion unit.

14. The electronic device according to claim 1,
wherein the photoelectric-conversion units include a plurality of divided photoelectric-conversion units, and
light polarized by the plurality of polarization elements is made to enter the plurality of divided photoelectric-conversion units of part of the photoelectric-conversion units.

15. The electronic device according to claim 1,
wherein the photoelectric-conversion units include a plurality of divided photoelectric-conversion units, and
light polarized by the polarization elements is made to enter part of the divided photoelectric-conversion units of some of the photoelectric-conversion units.

16. The electronic device according to claim 1,
wherein the photoelectric-conversion units include a plurality of divided photoelectric-conversion units, and
light polarized by the polarization elements is made to enter the divided photoelectric-conversion units of parts of two or more of the photoelectric-conversion units.

17. The electronic device according to claim 1,
wherein the plurality of photoelectric-conversion units includes a plurality of divided photoelectric-conversion units, and
light polarized by the plurality of polarization elements is made to enter the plurality of photoelectric-conversion units.

18. The electronic device according to claim 1,
wherein the photoelectric-conversion units include a plurality of divided photoelectric-conversion units that is divided in one direction and detects phase difference information, and
light polarized by the polarization elements is made to enter the plurality of divided photoelectric-conversion units of some of the photoelectric-conversion units.

19. A non-transitory computer readable medium storing program code for controlling an electronic device comprising a display and a capture unit arranged on a side opposite a displaying surface of the display, wherein the capture unit includes a plurality of photoelectric-conversion units that converts light that has been made to enter through the display into electricity and a plurality of polarization elements arranged on a light entering side of at least one photoelectric-conversion unit of the plurality of photoelectric-conversion units, the program code being executable to perform operations comprising:

correcting a captured image that has been converted from light into electricity by the plurality of photoelectric-conversion units, on a basis of polarization information that has been polarized by the plurality of polarization elements and has been converted from light into electricity; and estimating display luminance of the display, wherein correcting the captured image includes controlling a correction amount of the captured image that has been converted from light into electricity by the plurality of photoelectric-conversion units, according to the estimated display luminance of the display.

* * * * *